(12) United States Patent
Yamaguchi et al.

(10) Patent No.: US 12,406,415 B2
(45) Date of Patent: Sep. 2, 2025

(54) DEVICE, METHOD, AND NON-TRANSITORY COMPUTER-READABLE MEDIUM FOR PREPARING SINGLE-LINE DIAGRAM

(71) Applicant: Mitsubishi Electric Corporation, Tokyo (JP)

(72) Inventors: Yuta Yamaguchi, Tokyo (JP); Wataru Koshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 361 days.

(21) Appl. No.: 18/042,680

(22) PCT Filed: Sep. 17, 2020

(86) PCT No.: PCT/JP2020/035333
§ 371 (c)(1),
(2) Date: Feb. 23, 2023

(87) PCT Pub. No.: WO2022/059150
PCT Pub. Date: Mar. 24, 2022

(65) Prior Publication Data
US 2023/0368443 A1    Nov. 16, 2023

(51) Int. Cl.
*G01R 31/40*    (2020.01)
*G06T 11/20*    (2006.01)
*G06T 11/60*    (2006.01)

(52) U.S. Cl.
CPC ............ *G06T 11/206* (2013.01); *G01R 31/40* (2013.01); *G06T 11/60* (2013.01)

(58) Field of Classification Search
CPC ....... G06T 11/206; G06T 11/60; G01R 31/40; G06F 30/18; G06F 30/30; G06F 2111/12; G06F 2113/04
See application file for complete search history.

(56) References Cited

U.S. PATENT DOCUMENTS

2007/0220474 A1*  9/2007  Chang ................... G06F 30/394
                                            716/120
2020/0096959 A1*  3/2020  Gubba Ravikumar ......................
                                             G05B 17/02
(Continued)

FOREIGN PATENT DOCUMENTS

JP    2000092706 A    3/2000
JP    2002034152 A    1/2002
(Continued)

OTHER PUBLICATIONS

International Search Report (PCT/ISA/210) with translation and Written Opinion (PCT/ISA/237) mailed on Nov. 10, 2020, by the Japan Patent Office as the International Searching Authority for International Application No. PCT/JP2020/035333. (8 pages).

(Continued)

*Primary Examiner* — Jitesh Patel
(74) *Attorney, Agent, or Firm* — BUCHANAN, INGERSOLL & ROONEY PC

(57) ABSTRACT

A device generating a single-line diagram of each power system by diverting a part of a configuration common to the power systems is provided when a plurality of power systems having similar configurations exist. The device includes an input portion, a controller, and a storage. The input portion receives first setting related to a first power system, second setting related to a second power system, and third setting common to the first and second power systems. The controller generates setting data of a first single-line diagram including the first setting and the third setting, generates setting data of a second single-line diagram including the second setting and the third setting, and stores the setting data of the first single-line diagram and the setting data of the second single-line diagram in the storage.

19 Claims, 20 Drawing Sheets

(56) References Cited

U.S. PATENT DOCUMENTS

2020/0409323 A1* 12/2020 Spalt ................. G05B 13/0265
2022/0035976 A1*  2/2022 Dustman ................ G06F 30/31
2022/0398357 A1* 12/2022 Matsuda ................ G06F 30/12

FOREIGN PATENT DOCUMENTS

| JP | 2002078199 A | 3/2002 |
| JP | 2010124548 A | 6/2010 |
| JP | 2016144376 A | 8/2016 |
| JP | 2016174496 A | 9/2016 |

OTHER PUBLICATIONS

Notice of Reasons for Refusal with translation dated Mar. 23, 2021 issued by the Japan Patent Office in corresponding Japanese Patent Application No. 2020-569212. (7 pages).

* cited by examiner

| | 1601 | 1602 | 1603 | 1604 | 1605 |
|---|---|---|---|---|---|
| | ID | UNIT | DATA TYPE | MAXIMUM DATA | MINIMUM DATA |
| | INTERNAL DATA 1 | – | int32_t | 1000 | 0 |
| | INTERNAL DATA 2 | kV | double | 1000 | 0 |
| | INTERNAL DATA 3 | kA | double | 1000 | 0 |

| LAYER | SYMBOL | INFORMATION |
|---|---|---|
| 1710 — LAYER 1 (COMMON SETTING) | | |
| | SYMBOL 1 | SCREEN DISPLAY INFORMATION |
| | | INTERNAL DATA REFERENCE INFORMATION |
| | SYMBOL 2 | SCREEN DISPLAY INFORMATION |
| | | INTERNAL DATA REFERENCE INFORMATION |
| | ⋮ | ⋮ |
| 1720 — LAYER 2 (MONITORING DEVICE A) | | |
| | SYMBOL 10 | |
| | | ⋮ |
| | ⋮ | ⋮ |

DEVICE, METHOD, AND NON-TRANSITORY COMPUTER-READABLE MEDIUM FOR PREPARING SINGLE-LINE DIAGRAM

TECHNICAL FIELD

The present disclosure relates to a technique for preparing a single-line diagram, and more specifically, to reduction of man-hours for preparing the single-line diagram.

BACKGROUND ART

Regarding the single-line diagram, for example, Japanese Patent Laying-Open No. 2002-34152 (PTL 1) discloses a substation facility management device in which "an actual instrument data preparing portion prepares actual instrument data of a single-line diagram, a protection linkage, and an operation linkage to which instrument individual information is written by writing the instrument individual information of the search result in a corresponding region in each design data based on a search result obtained by transmitting a search command to each search unit and previously-retaining design data of the single-line diagram, design data of the protection linkage, and design data of the operation linkage, and outputs a creation result" (see [abstract]).

CITATION LIST

Patent Literature

PTL 1: Japanese Patent Laying-Open No. 2002-34152

SUMMARY OF THE INVENTION

Technical Problem

According to the technique disclosed in PTL 1, when a plurality of similar power systems exist, the single-line diagram of each power system is required to be individually prepared even when most of the configurations of the power systems are the same. Accordingly, when the plurality of power systems having similar configurations exist, a technique for preparing the single-line diagram of each power system is required by diverting a part of a configuration common to each power system.

The present disclosure has been made in view of the background as described above, and an object in one aspect is to provide a technique for preparing the single-line diagram of each power system by diverting the part of the configuration common to each power system when the plurality of power systems having similar configurations exist.

Solution to Problem

A device according to an embodiment includes an input portion to receive an operation related to a single-line diagram, a controller to generate setting data of the single-line diagram based on the operation, and a storage to store the setting data. The input portion receives first setting related to a first power system, second setting related to a second power system, and third setting common to the first and second power systems. The controller generates setting data of a first single-line diagram including the first setting and the third setting, generates setting data of a second single-line diagram including the second setting and the third setting, and stores the setting data of the first single-line diagram and the setting data of the second single-line diagram in the storage.

Advantageous Effects of Invention

According to the embodiment, when the plurality of power systems having similar configurations exist, the single-line diagram of each power system can be prepared by diverting the part of the configuration common to each power system.

The foregoing and other objects, features, aspects and advantages of the present disclosure content will become more apparent from the following detailed description of the present disclosure when taken in conjunction with the accompanying drawings.

BRIEF DESCRIPTION OF DRAWINGS

FIG. 16 is a view illustrating an example of incidental information 1600 about internal data 1310.

FIG. 17 is a view illustrating an example of a configuration of a setting file 1700 included in the editing data of the single-line diagram.

DESCRIPTION OF EMBODIMENTS

Figure 1:
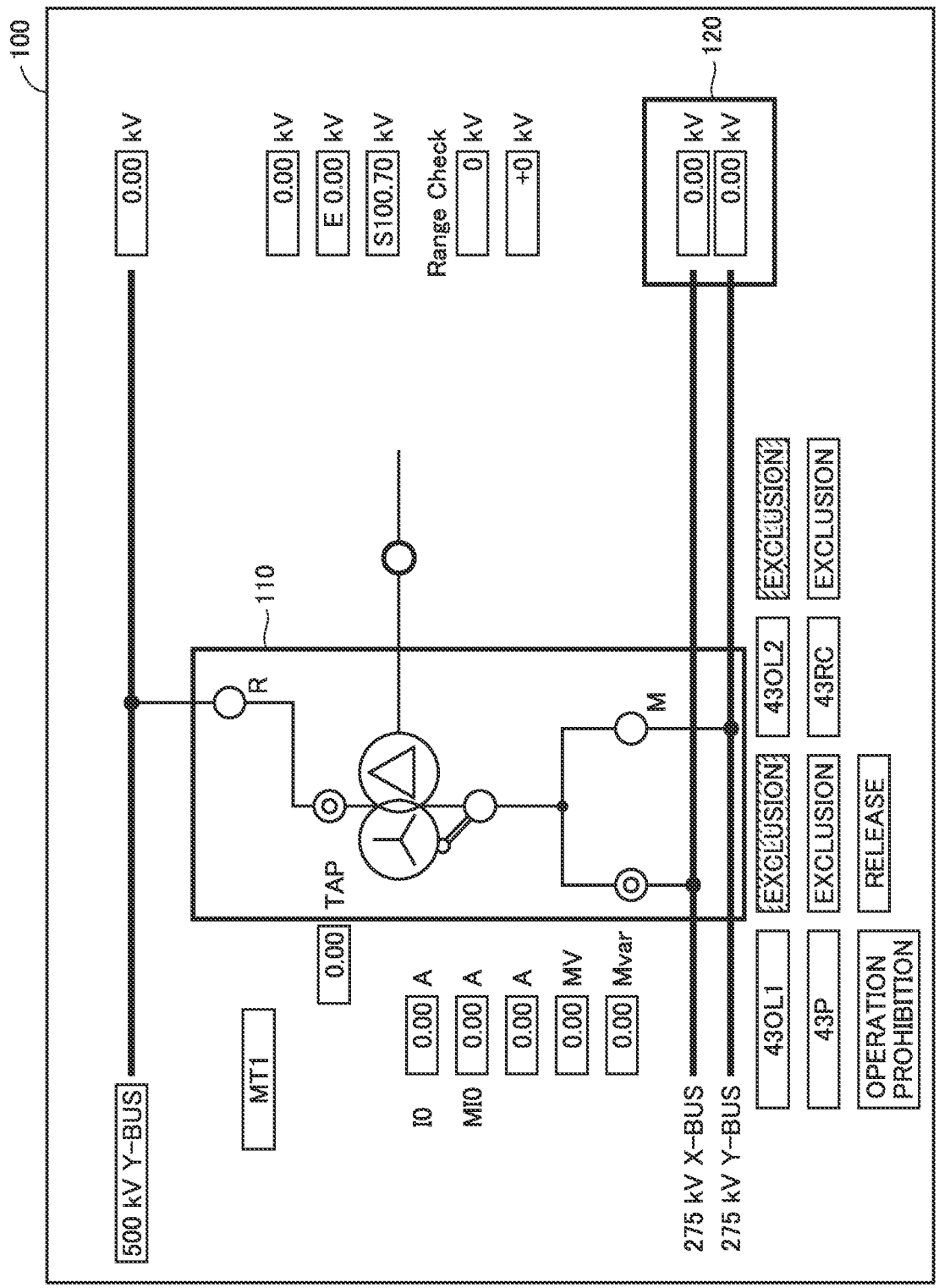
FIG. 1 is a view illustrating an example of display of a single-line diagram 100 according to an embodiment.

Hereinafter, an embodiment of the technical idea according to the present disclosure will be described with reference to the drawings. In the following description, the same component is denoted by the same reference numeral. Those names and functions are the same. Accordingly, the detailed description thereof will not be repeated. In the following description, when referring to a plurality of the same configurations, they are sometimes expressed as configurations 123A, 123B. In addition, the plurality of the same configurations are expressed as a configuration 123 when collectively referred to.

First Embodiment

FIG. 1 is a view illustrating an example of display of a single-line diagram 100 according to a first embodiment. The "single-line diagram" displays a state of a power system and supplementary information using an image, a numerical value, a character, and the like. Single-line diagram 100 is displayed on a display or the like of a monitoring device. For example, the "monitoring device" monitors a certain facility in a substation. An administrator of the power system can grasp the state of the power system and appropriately perform maintenance of the facility by checking single-line diagram 100.

Single-line diagram 100 represents a certain power system, and roughly includes a symbol 110 and internal data 120. Single-line diagram 100 can be prepared by the number of power systems of a maintenance target. For example, when three power systems of the maintenance target exist, single-line diagram 100 corresponding to each of the three power systems of the maintenance target is prepared.

Symbol 110 indicates a configuration included in the power system. In one aspect, the configuration can include a component, a facility, or an instrument, such as a power line and a switch, which constitute the power system. In another aspect, symbol 110 may further include components such as a label, a text box, and a button, which display the supplementary information of the power system.

Internal data 120 is dynamically changing data associated with each symbol. The "internal data" represents an actual measurement value of information about each symbol. For example, the information about the symbol is voltage or current. In other words, the internal data is data indicating the internal state of a certain facility or instrument. The numerical value displayed in the text box or the like can dynamically change according to the state of internal data 120. As an example, internal data 120 in FIG. 1 includes the voltage at an X-bus and the voltage at a Y-bus. Internal data 120 dynamically changes according to the state of internal data 120 including the voltage at the X-bus and the voltage at the Y-bus of a certain facility. In one aspect, internal data 120 can represent the voltage, the current, any information obtained from an arithmetic operation, and any sensor values (gas pressure, temperature, and the like).

The monitoring device displays single-line diagram 100 on the display by reading setting data of the single-line diagram. For example, the "setting data of the single-line diagram" includes the number of symbols 110, coordinates, color information, and the like included in the single-line diagram and association information about each symbol 110 and internal data 120.

The setting data of the single-line diagram is generated in the setting device of the single-line diagram. The "setting device in the single-line diagram (hereinafter, the setting device in the single-line diagram is simply referred to as a "setting device")" has a function for receiving operation input from a user and a function for editing a screen of single-line diagram 100, associating each symbol 110 and each internal data 120, and the like based on the operation input. In one aspect, setting device 400 may be a personal computer, a workstation, or a virtual machine built on a cloud environment.

In another aspect, the setting device and the monitoring device may be the same instrument. In another aspect, the setting device and the monitoring device may be different instruments. In this case, the monitoring device can display single-line diagram 100 on the display by acquiring the setting data of the single-line diagram from the setting device.

Figure 2:
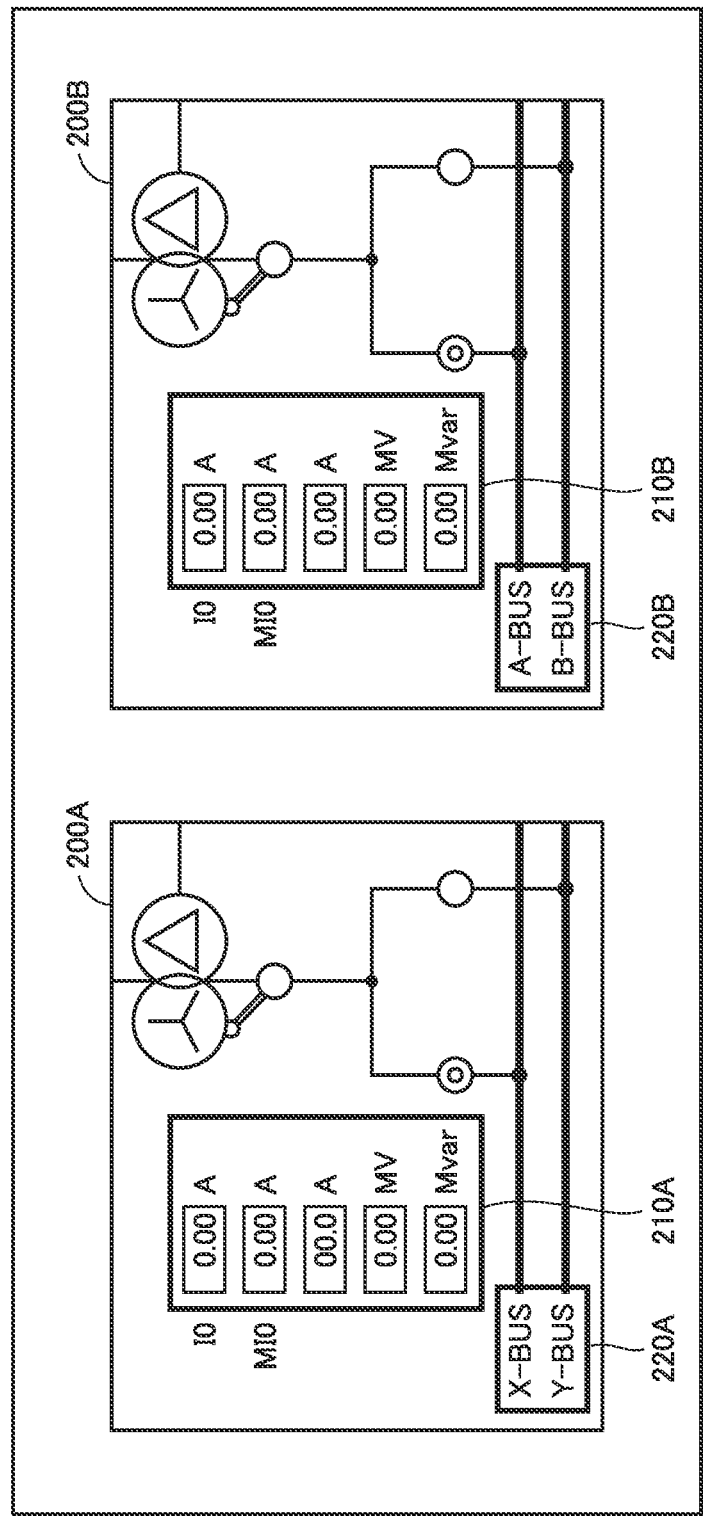
FIG. 2 is a view illustrating an example of single-line diagrams 200A, 200B of power systems A, B, respectively.
Figure 3:
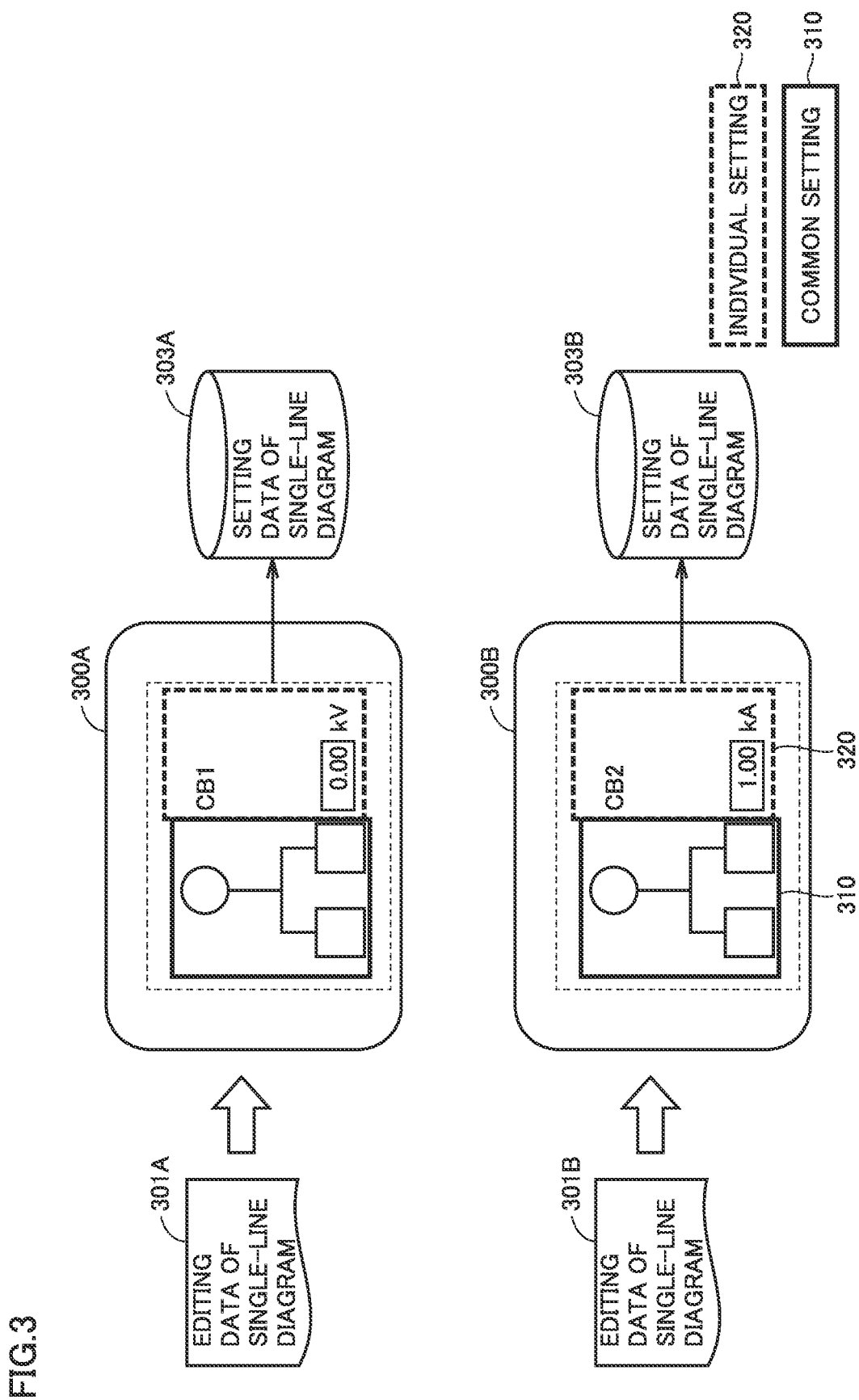
FIG. 3 is a view illustrating an example of data related to single-line diagrams 300A, 300B including common setting and individual setting.

With reference to FIGS. 2 and 3, a problem in preparing a plurality of single-line diagrams will be described below. Hereinafter, it is assumed that a certain substation includes a plurality of power systems A, B (individual facilities A, B).

FIG. 2 is a view illustrating an example of single-line diagrams 200A, 200B of power systems A, B, respectively. Single-line diagram 200A includes a symbol 210A and a symbol 220A. Single-line diagram 200B includes a symbol 210B and a symbol 220B.

When the single-line diagram displayed on each of the plurality of monitoring devices installed in one substation is a single-line diagram of a power system connected to the same bus, the single-line diagrams often have configurations similar to each other as illustrated in FIG. 2. However, although the single-line diagrams have many common setting contents, the single-line diagrams are not completely the same, and only a part of the numbers of the instruments or the names of the buses may be different. For example, in single-line diagrams 200A, 200B, symbol 210A and symbol 210B are common. However, it can be seen that symbol 220A and symbol 220B have different bus names.

In the conventional method for preparing the single-line diagram, the user need to individually prepare single-line diagrams 200A, 200B having only different details as described above. Such single-line diagrams 200A, 200B include the common setting and the individual setting.

FIG. 3 is a view illustrating an example of data related to single-line diagrams 300A, 300B including the common setting and the individual setting. With reference to FIG. 3, the data that causes an increase in man-hours for preparing the plurality of single-line diagrams are prepared will be described. Single-line diagram 300A is displayed on the screen of monitoring device A, and single-line diagram 300B is displayed on the screen of monitoring device B.

The user prepares editing data of the single-line diagram using the setting device. The "editing data of the single-line diagram" is data that can be edited by the setting device. The user can edit the single-line diagram by editing the editing data of the single-line diagram. The setting device generates the setting data of the single-line diagram based on the editing data of the single-line diagram. The monitoring device displays the single-line diagram on the display based on the setting data of the single-line diagram.

In the example of FIG. 3, the user edits editing data 301A of the single-line diagram using the setting device. The setting device generates setting data 303A of the single-line diagram read by monitoring device A based on editing data 301A of the single-line diagram. Monitoring device A displays single-line diagram 300A on the display based on setting data 303A of the single-line diagram.

Similarly, the user edits editing data 301B of the single-line diagram using the setting device. The setting device generates setting data 303B of the single-line diagram read by monitoring device B based on editing data 301B of the single-line diagram. Monitoring device B displays single-line diagram 300B on the display based on setting data 303B of the single-line diagram.

Editing data 301A, 301B of the single-line diagram include a common setting 310 and an individual setting 320 for each of monitoring devices A, B. In the conventional technique, the user needs to prepare common setting 310 and individual setting 320 for both editing data 301A, 301B of the single-line diagram. This causes the increase in the man-hours for preparing the single-line diagram. Accordingly, the setting device of the first embodiment provides a function that can use common setting 310 when editing data 301A, 301B of the single-line diagram are prepared.

With reference to FIGS. 4 to 7, the function provided by the setting device of the first embodiment will be described below. The setting device of the first embodiment provides the function for preparing each of the single-line diagrams by diverting the common setting to each of the single-line diagrams during the preparation of the plurality of single-line diagrams. Details of the function will be described below.

Figure 4:
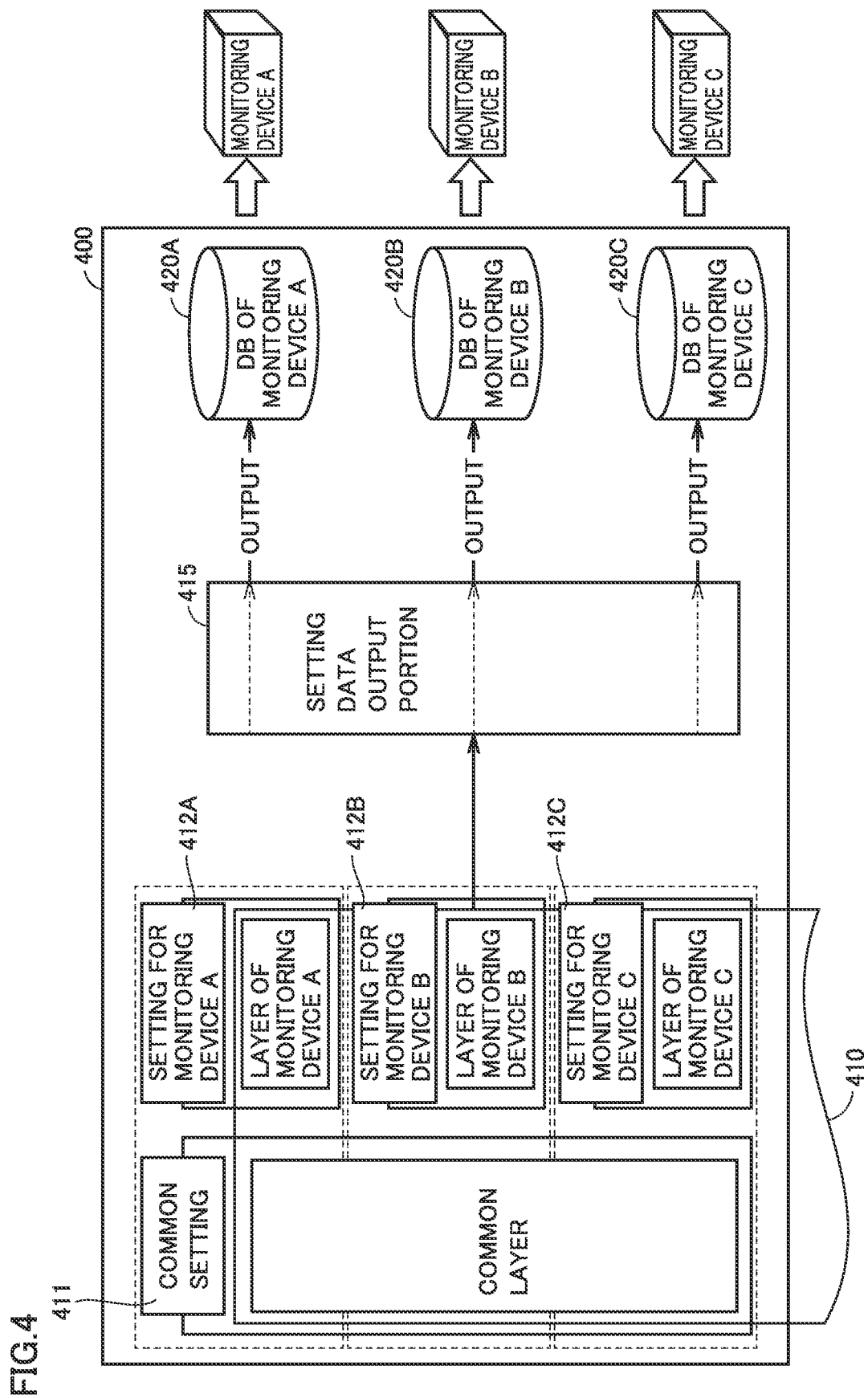
FIG. 4 is a view illustrating an example of data generated by a setting device 400 according to an embodiment.

FIG. 4 is a view illustrating an example of data generated by a setting device 400 of the first embodiment. It is assumed that setting device 400 generates the setting data of the single-line diagram for three monitoring devices A, B, C.

Setting device 400 generates editing data 410 of the single-line diagram based on the operation input of the user. Editing data 410 of the single-line diagram includes a common setting 411 and an individual setting 412. The "common setting" is a setting common to each monitoring device. The "individual setting" is an individual setting of each monitoring device. As an example, symbols common to the single-line diagrams displayed by monitoring devices A, B, C are included in common setting 411. The symbol included only in the single-line diagram displayed by monitoring device A is included in individual setting 412A. Hereinafter, when the common setting and the individual setting are collectively referred to, they are simply referred to as "setting".

Common setting 411 and individual setting 412 include a layer. Alternatively, common setting 411 and individual setting 412 themselves may be the layer. The "layer" is obtained by disposing one or a plurality of symbols in a certain region. Setting device 400 can superimpose these layers. For example, the layer of common setting 411 includes one or the plurality of symbols common to the single-line diagrams displayed by monitoring devices A, B, C. The layer of individual setting 412 includes one or the plurality of symbols included only in the single-line diagram displayed by each of monitoring devices A, B, C.

A setting data output portion 415 generates single-line diagram setting data by superimposing the layer of common setting 411 and the layer of individual setting 412. As an example, setting data output portion 415 generates the setting data of the single-line diagram for monitoring device A by superimposing the layer of common setting 411 and the layer of individual setting 412A. In one aspect, setting data output portion 415 can arbitrarily change overlapping order between the layer of common setting 411 and the layer of individual setting 412A based on operation input of the user. In another aspect, setting data output portion 415 can change display/non-display setting of each layer or each symbol included in each layer based on the operation input of the user.

Setting data output portion 415 stores setting data of the single-line diagrams for monitoring devices A to C in databases (DBs) 420A to 420C of the monitoring devices. Monitoring devices A to C can display the single-line diagrams on the display based on the setting data of the single-line diagrams acquired from DBs 420A to 420C of the respective monitoring devices. In one aspect, DBs 420A to 420C of the monitoring devices may be a single DB. In another aspect, setting data output portion 415 may only write the setting data of the single-line diagrams for monitoring devices A to C to a nonvolatile memory.

Figure 5:
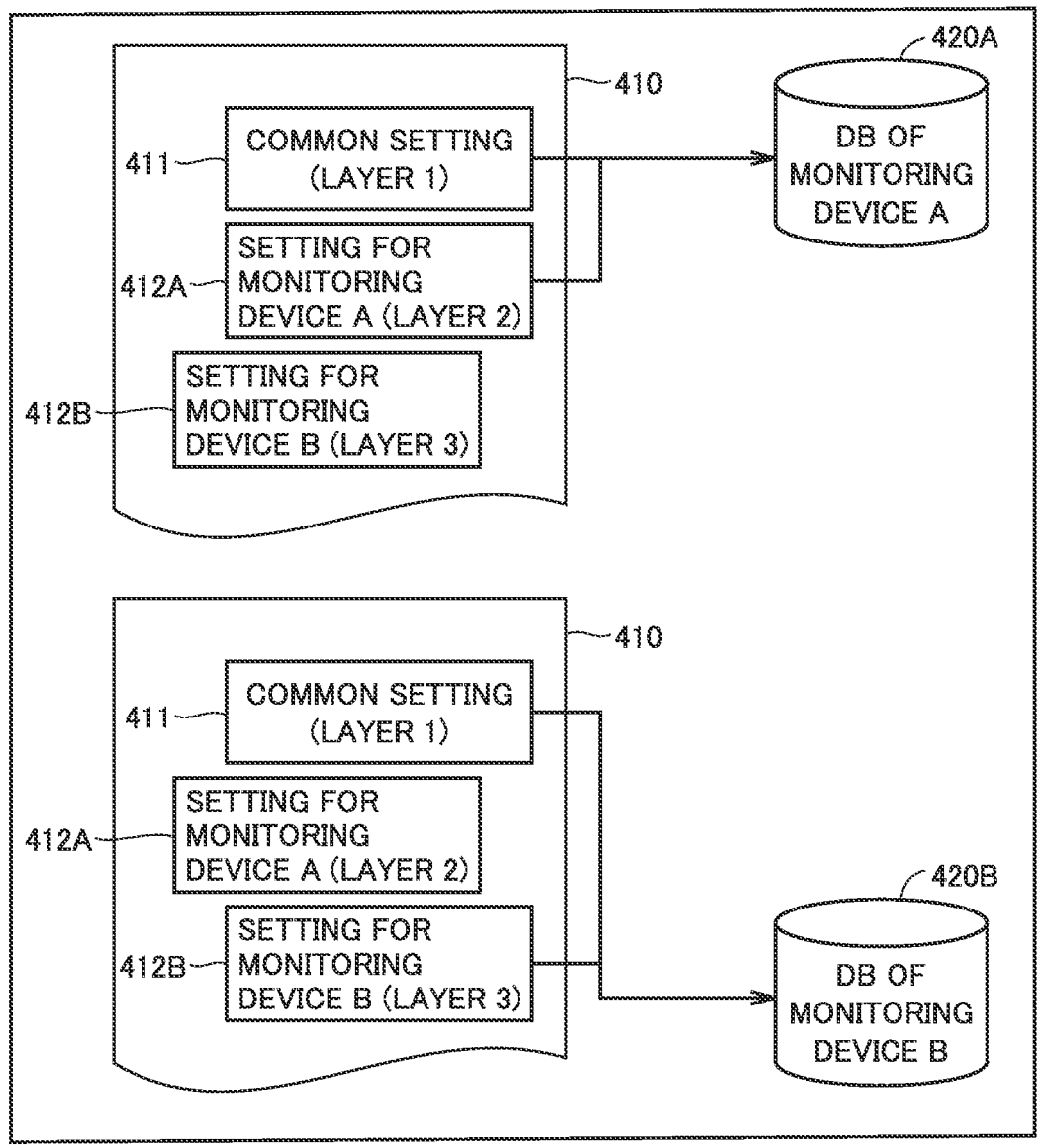
FIG. 5 is a view illustrating an example of a circumstance of generation of setting data in a single-line diagram of each monitoring device.

FIG. 5 is a view illustrating an example of a circumstance of generation of setting data in the single-line diagram of each monitoring device. The setting data of the single-line diagram for monitoring device A is generated based on common setting 411 and individual setting 412A. The setting data of the single-line diagram for monitoring device B is generated based on common setting 411 and individual setting 412B. It can be seen that common setting 411 is used not only when the setting data of the single-line diagram of monitoring device A is generated but also when the setting data of the single-line diagram for monitoring device B is generated.

Figure 6:
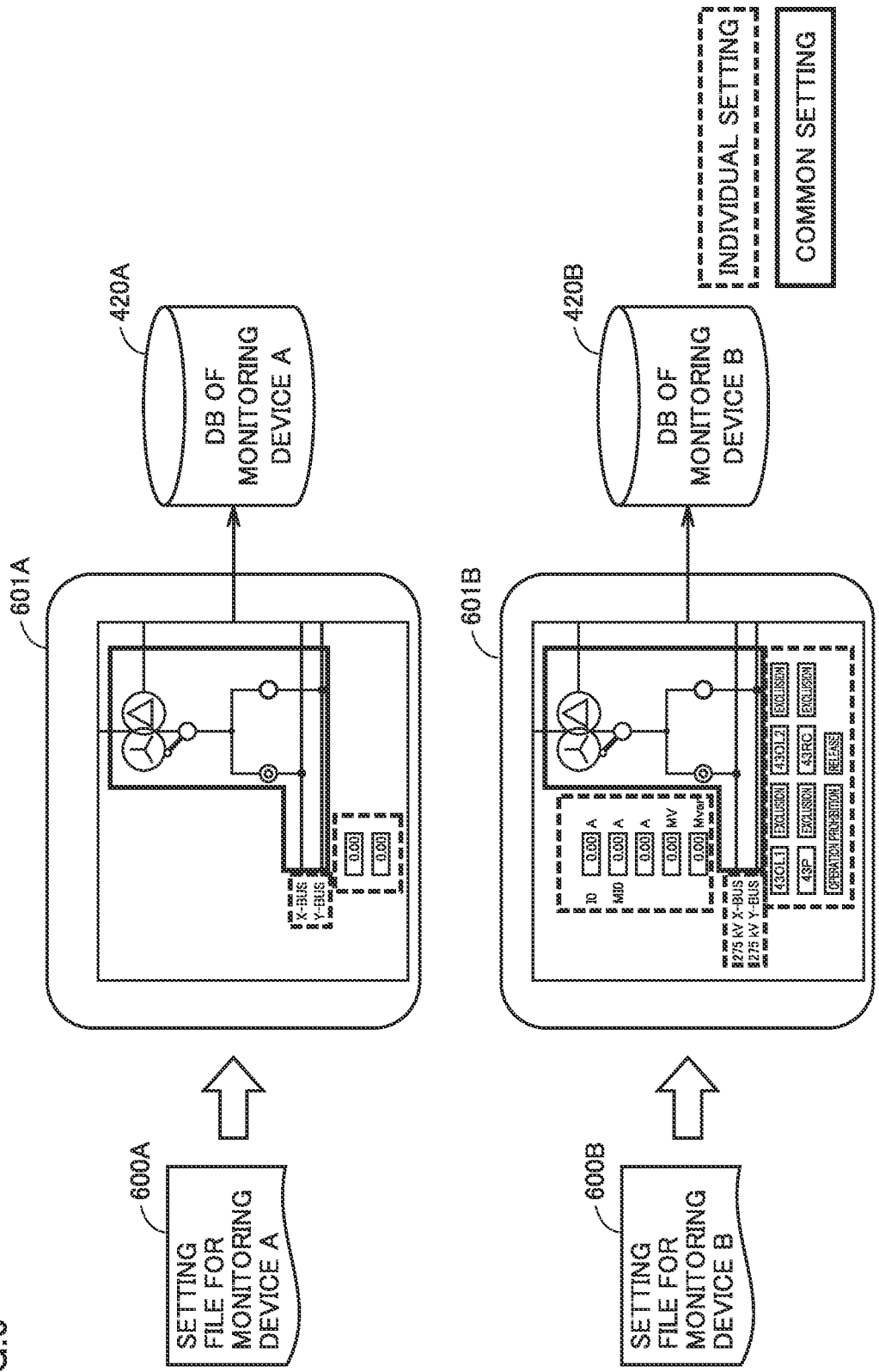
FIG. 6 is a view illustrating an example of a relationship between the single-line diagram displayed by each monitoring device and a setting file of each monitoring device.

FIG. 6 is a view illustrating an example of a relationship between the single-line diagram displayed by each monitoring device and a setting file of each monitoring device. At this point, the "setting file" refers to a group of data generating the setting data of the single-line diagram. For example, the setting file of monitoring device A includes common setting 411 and individual setting 412A. Alternatively, when simply referred to as the setting file, the setting file can include common setting 411 and individual settings 412 of all the monitoring devices.

Referring to FIG. 6, a setting file 600A for monitoring device A includes common setting 411 and individual setting 412A for monitoring device A. A setting file 600B for monitoring device B includes common setting 411 and individual setting 412B for monitoring device B.

Monitoring device A displays a single-line diagram 601A on the display based on the single-line diagram for monitoring device A. The symbol common to each monitoring device included in single-line diagram 601A is included in common setting 411. The symbol individual for monitoring device A included in single-line diagram 601A are included in individual setting 412A.

Similarly, monitoring device B displays a single-line diagram 601B on the display based on the single-line diagram for monitoring device B. The symbol common to the respective monitoring devices included in single-line diagram 601B are included in common setting 411. The symbol individual for monitoring device B included in single-line diagram 601B are included in individual setting 412B.

Figure 7:
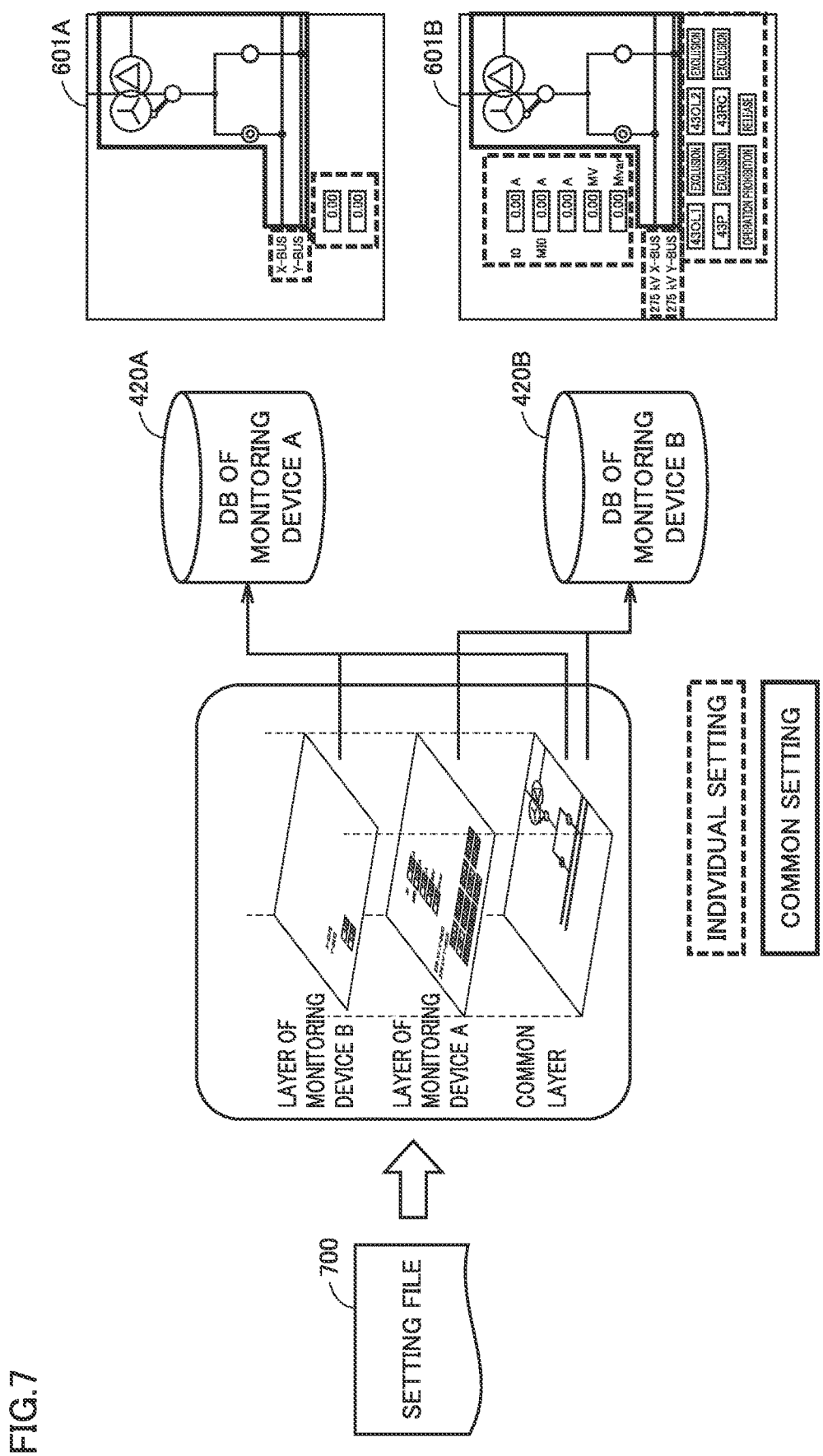
FIG. 7 is a view illustrating an example of a layer included in the setting file.

FIG. 7 is a view illustrating an example of the layer included in the setting file. A setting file 700 in FIG. 7 includes common setting 411, individual setting 412A, and individual setting 412B. In other words, setting file 700 includes the common layer, the layer for monitoring device A, and the layer for monitoring device B. Setting file 700 may also include information on overlapping order of these layers. When generating the setting data of the single-line diagram of each monitoring device, setting device 400 can combine the settings (common setting 411 and individual setting 412) based on the information about the overlapping order of the layers.

As described with reference to FIGS. 4 to 7, setting device 400 has the function for generating the setting data of the single-line diagram for each monitoring device using common setting 411 common to each monitoring device. With this function, the user can divert common setting 411 to easily prepare the setting data of the single-line diagram for each monitoring device by preparing common setting 411 common to each monitoring device only once. As a result, the man-hours for preparing the setting data of the single-line diagram can be reduced.

With reference to FIGS. 8 to 12, the details of the software and hardware configuration of setting device 400 and the internal operation of setting device 400 will be described below.

Figure 8:
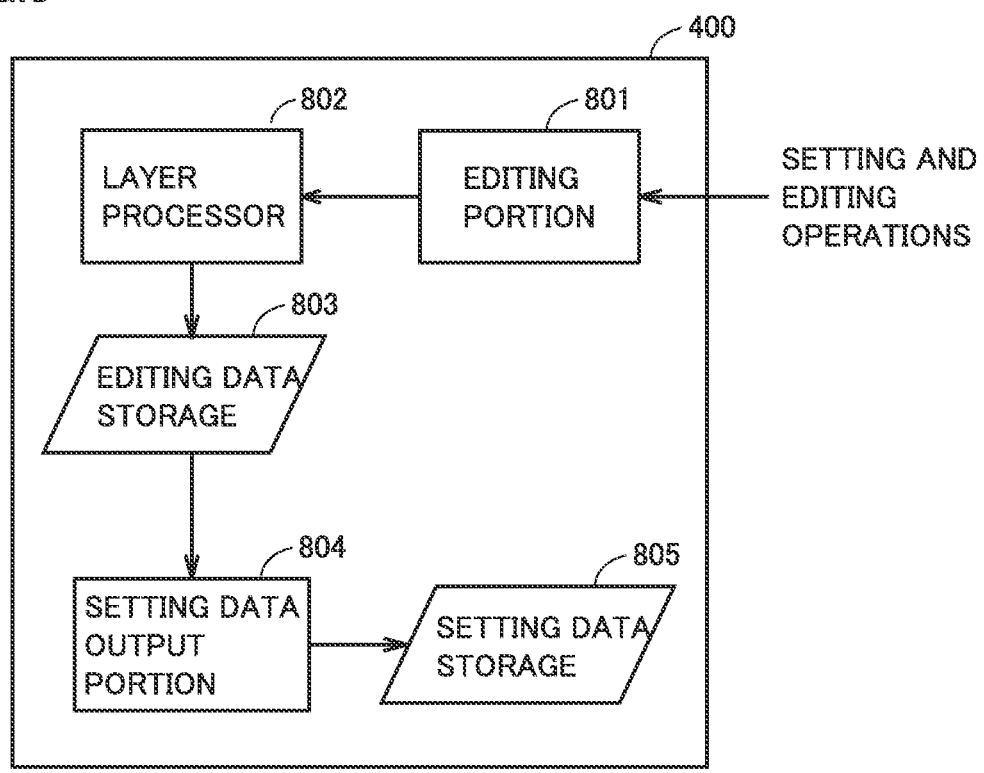
FIG. 8 illustrates an example of a configuration of a functional block of the setting device 400.

FIG. 8 illustrates an example of a configuration of a function for implementing setting device 400. In one aspect, the functional block in FIG. 8 can be implemented as hardware. In another aspect, the functional block in FIG. 8 can be implemented as software. In that case, each functional block may be executed on the hardware in FIG. 9. Setting device 400 includes an editing portion 801, a layer processing portion 802, an editing data storage 803, a setting data output portion 804, and a setting data storage 805.

Editing portion 801 provides an editing screen (user interface) editing the editing data of the single-line diagram. The user can execute the preparation, editing, deletion, and the like of the editing data of the single-line diagram by operating the editing screen from the input device provided in setting device 400. When receiving a storage operation, editing portion 801 stores the editing data of the single-line diagram in editing data storage 803 through layer processing portion 802.

Layer processing portion 802 executes processing related to each layer included in the editing data of the single-line diagram. For example, layer processing portion 802 provides a layer-by-layer display/non-display switching function. In addition, layer processing portion 802 executes processing for superimposing each layer or the like based on the setting of superimposition order input by the user. Layer processing portion 802 superimposes and displays each layer included in the editing data of the single-line diagram on the editing screen based on the setting of the overlapping order of the layers.

In one aspect, layer processing portion 802 can superimpose each layer to generate editable editing data of the single-line diagram, and output the editing data of the single-line diagram to editing portion 801. In another aspect, layer processing portion 802 may be incorporated in editing portion 801 as one function. When the storage processing is executed in editing portion 801, layer processing portion 802 stores the editing data of the single-line diagram in editing data storage 803.

Setting device 400 can provide various functions by combining editing portion 801 and layer processing portion 802. For example, setting device 400 can switch between the display and the non-display in units of layers or symbols based on the operation input on the editing screen. When a certain layer becomes the non-display, the symbols disposed on the layer becomes also the non-display. In addition, setting device 400 can change the overlapping order of the layers based on the operation input on the editing screen. Furthermore, setting device 400 can dispose the symbol in each layer based on the operation input on the editing screen.

Editing data storage 803 stores the editing data of the single-line diagram. In one aspect, editing data storage 803 may store the editing data of individual single-line diagrams. In another aspect, editing data storage 803 may store each layer and reference information for each layer. In this case, editing portion 801/layer processing portion 802 can reconstruct the editing data of each single-line diagram from each layer and the reference information for each layer based on the reception of the operation of reading the editing data of the single-line diagram.

Setting data output portion 804 converts the editing data of the single-line diagram stored in editing data storage 803 into the setting data of the single-line diagram, and stores the setting data of the single-line diagram in setting data storage 805. Each setting includes "application target information" indicating which monitoring device the setting itself is for. For example, the common setting includes the application target information indicating that the common setting is common to all the monitoring devices. The individual setting of monitoring device A includes the application target information indicating that the data is for monitoring device A. Setting data output portion 804 can generate the setting data of the single-line diagram by combining required settings based on these pieces of application target information.

Setting data storage 805 stores the setting data of the single-line diagram. In one aspect, setting data storage 805 may transmit the setting data of the single-line diagram to the monitoring device based on acceptance of a request for the setting data of the single-line diagram from the monitoring device.

Figure 9:
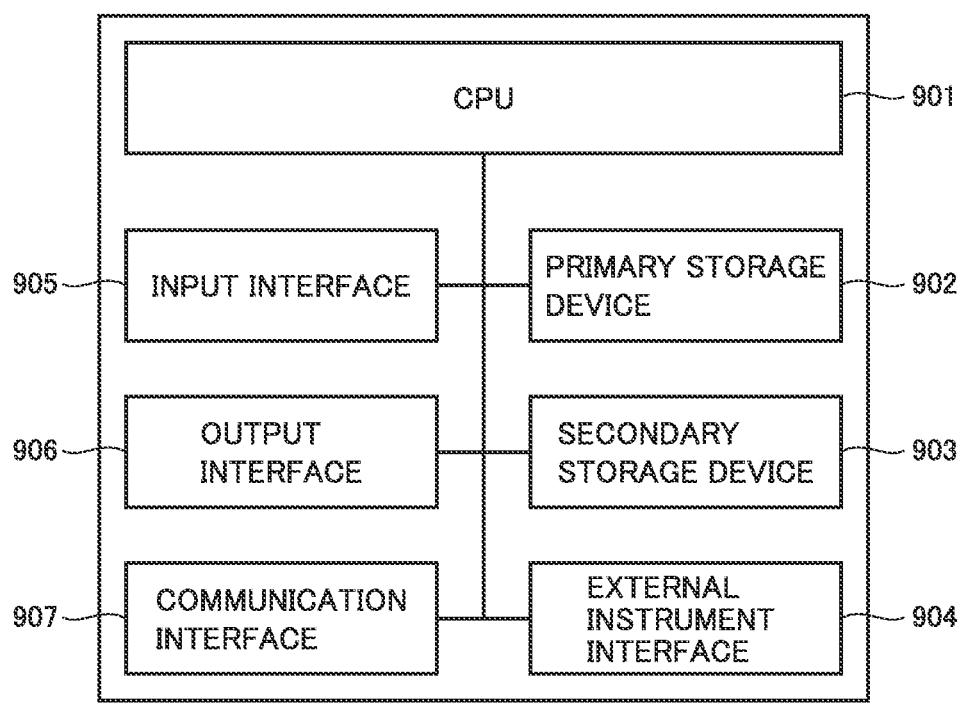
FIG. 9 illustrates an example of a hardware configuration of an information processing device 900.

FIG. 9 illustrates an example of a hardware configuration of information processing device 900. Setting device 400 can be implemented by information processing device 900. Information processing device 900 includes a central processing unit (CPU) 901, a primary storage device 902, a secondary storage device 903, an external instrument interface 904, an input interface 905, an output interface 906, and a communication interface 907. In one aspect, setting device 400 may be implemented by combining a plurality of information processing devices 900.

CPU 901 can execute a program implementing various functions of information processing device 900. For example, CPU 901 is constructed with at least one integrated circuit. For example, the integrated circuit may be constructed of at least one CPU, at least one field programmable gate array (FPGA), an application specific integrated circuit (ASIC), a combination thereof, or the like.

Primary storage device 902 stores the program executed by CPU 901 and data referred to by CPU 901. In one aspect, primary storage device 902 may be implemented by a dynamic random access memory (DRAM), a static random access memory (SRAM), or the like.

Secondary storage device 903 is a nonvolatile memory, and may store the program executed by CPU 901 and the data referred to by CPU 901. In this case, CPU 901 executes the program read from secondary storage device 903 to primary storage device 902, and refers to the data read from secondary storage device 903 to primary storage device 902. In one aspect, secondary storage device 903 may be implemented by a hard disk drive (HDD), a solid state drive (SSD), an erasable programmable read only memory (EPROM), an electrically erasable programmable read only memory (EEPROM), a flash memory, or the like.

External instrument interface 904 can be connected to any external instrument such as a printer, a scanner, and an external HDD. In one aspect, external instrument interface 904 may be implemented by a universal serial bus (USB) terminal or the like.

Input interface 905 can be connected to any input device such as a keyboard, a mouse, a touchpad, or a game pad. In one aspect, input interface 905 may be implemented by a USB terminal, a PS/2 terminal, a Bluetooth (registered trademark) module, and the like.

Output interface 906 can be connected to any output device such as a cathode ray tube display, a liquid crystal display, or an organic electro-luminescence (EL) display. In one aspect, output interface 906 may be implemented by a USB terminal, a D-sub terminal, a digital visual interface (DVI) terminal, a high-definition multimedia interface (HDMI) (registered trademark) terminal, or the like.

Communication interface 907 is connected to a wired or wireless network instrument. In one aspect, communication interface 907 may be implemented by a wired local area network (LAN) port, a wireless fidelity (Wi-Fi (registered trademark)) module, or the like. In another aspect, communication interface 907 may transmit and receive the data using a communication protocol such as Transmission Control Protocol/Internet Protocol (Transmission Control Protocol/Internet Protocol) or User Datagram Protocol (UDP).

Figure 10:
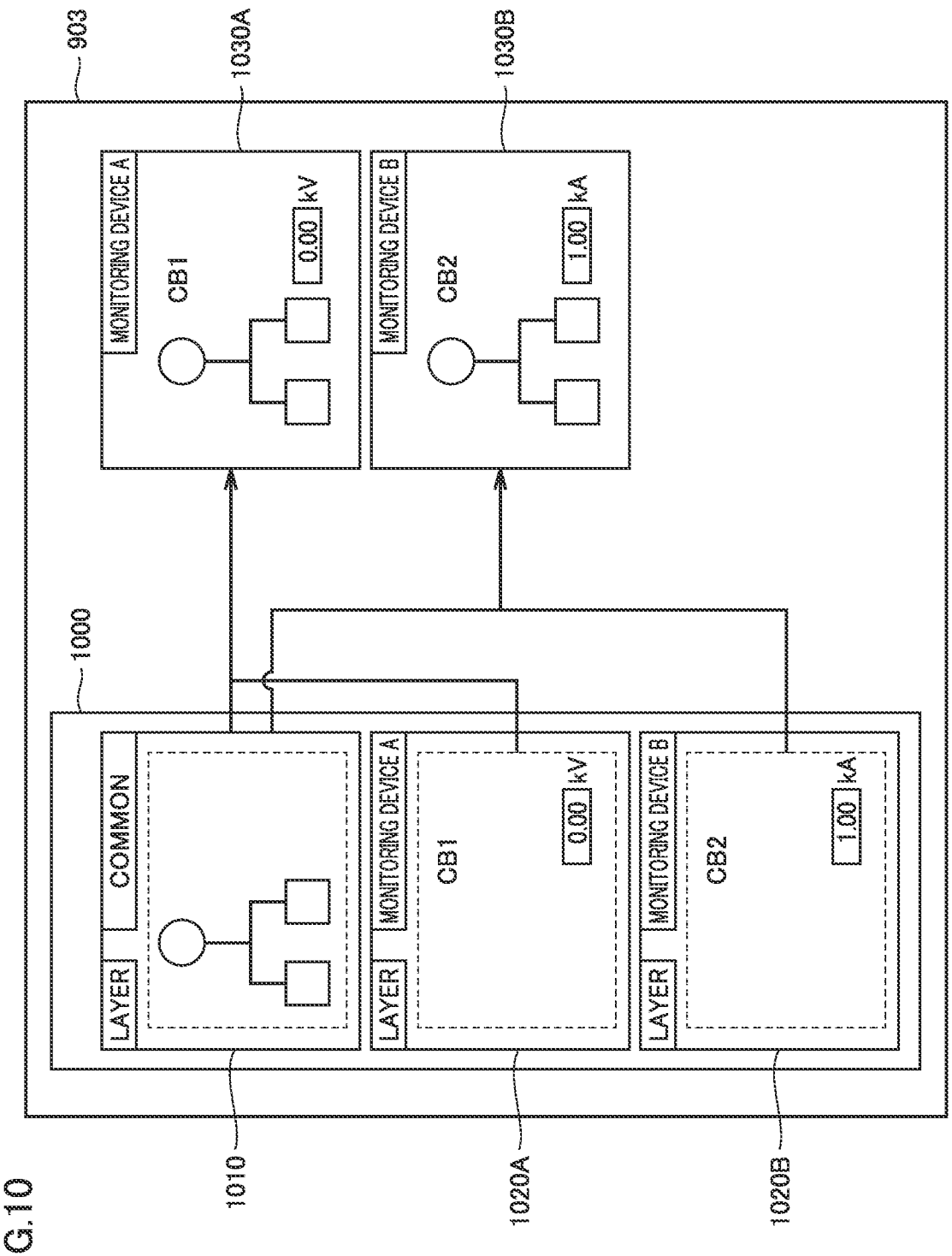
FIG. 10 is a view illustrating an example of editing data of the single-line diagram and setting data of the single-line diagram that are stored in the setting device 400.

FIG. 10 is a view illustrating an example of the editing data of the single-line diagram and the setting data of the single-line diagram that are stored in setting device 400. The editing data of the single-line diagram can be stored in secondary storage device 903. Secondary storage device 903 stores editing data 1000 of the single-line diagram and setting data 1030 of the single-line diagram.

Editing data 1000 of the single-line diagram is stored in a region secured as editing data storage 803 on secondary storage device 903. Editing data storage 803 can store editing data 1000 of one or the plurality of single-line diagrams. Editing data 1000 of the single-line diagram includes one or the plurality of settings (common setting or/and individual setting).

Each setting includes one layer in editing data 1000 of the single-line diagram. Furthermore, each setting includes the setting of the overlapping order of layers, the setting of display/non-display of layers, and the setting of display/non-display of symbols included in layers. In the example of FIG. 10, editing data 1000 of the single-line diagram includes common setting 1010, individual setting 1020A of monitoring device A, and individual setting 1020B of monitoring device B. Common setting 1010 includes the layer common to monitoring devices A, B, and each of individual settings 1020A, 1020B includes the individual layer for monitoring devices A, B.

The layer can constitute by combining one or a plurality of pre-componentized symbols. Each symbol is a partial element constituting the single-line diagram, and may be a figure component (for example, a square, a line, a circle, or the like), a character string, a numerical value, any other component, or a combination thereof.

In addition, the layer includes a region in which the symbol can be disposed. A size of the region is common in the layers. Furthermore, the layer includes application target information. The application target information indicates whether the layer is the layer common among all the monitoring devices (the layer of the common setting) or the individual layer of a certain monitoring device (the layer of the individual setting).

Setting data 1030 of the single-line diagram is stored in the region secured as setting data storage 805 on secondary storage device 903. In the example of FIG. 10, setting data 1030A of the single-line diagram for monitoring device A and setting data 1030B of the single-line diagram for monitoring device B are stored in secondary storage device 903.

Figure 11:
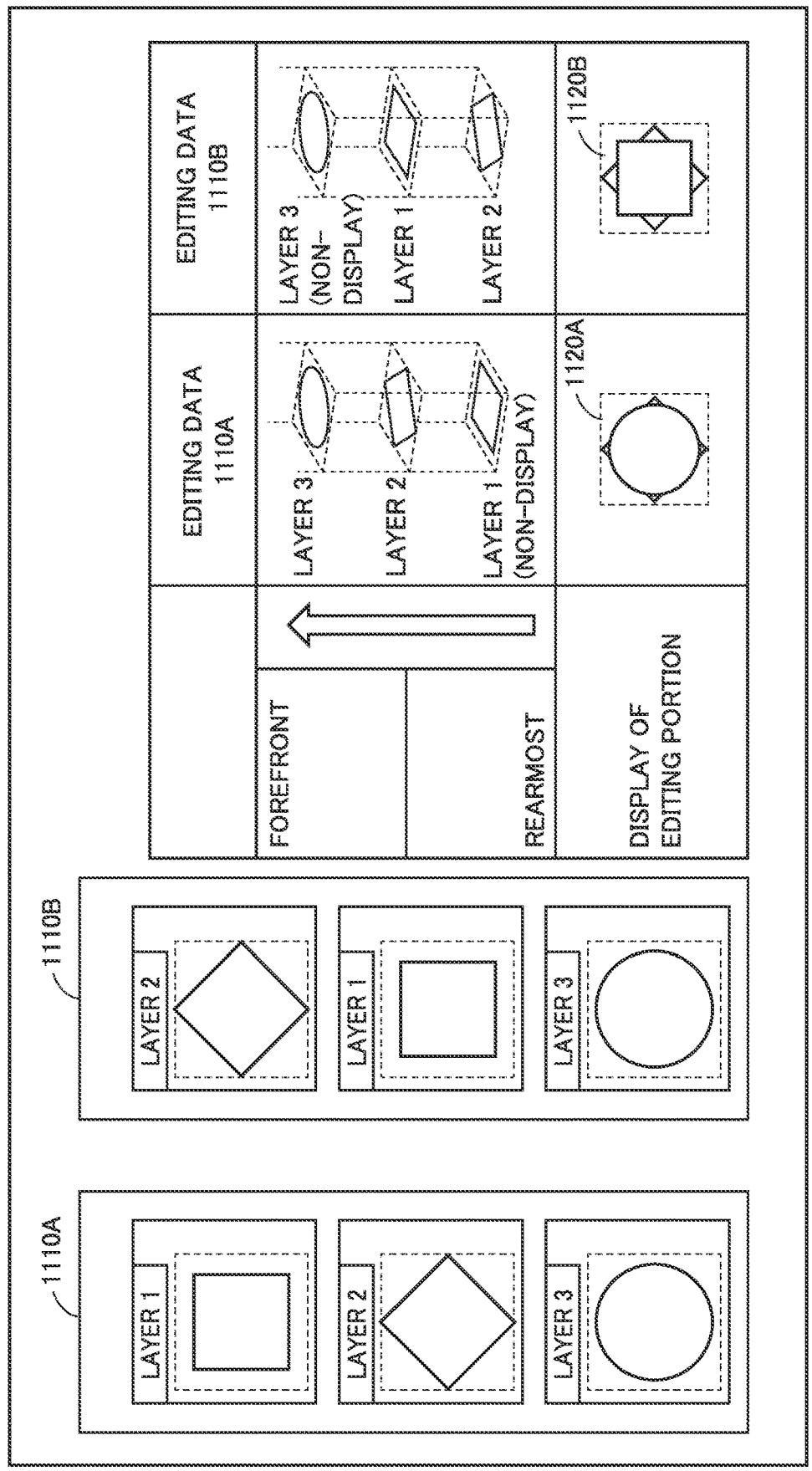
FIG. 11 is a view illustrating an example of a symbol included in the layer.

FIG. 11 is a view illustrating an example of the symbol included in the layer. In the example of FIG. 11, setting device 400 stores editing data 1110A of the single-line diagram and editing data 1110B of the single-line diagram.

It is assumed that setting device 400 stores the editing data of the single-line diagram including layers 1 to 3 (setting). The user can easily produce editing data (corresponding to setting files 600A, 600B in FIG. 6) of the single-line diagram for each monitoring device using layers 1 to 3 by preparing layers 1 to 3 only once.

For example, setting device 400 can prepare editing data 1110A (the setting file of monitoring device A) of the single-line diagram for monitoring device A based on the operation input of the user. Similarly, setting device 400 can prepare editing data 1110B (the setting file of monitoring device B) of the single-line diagram for monitoring device B based on the operation input of the user. Editing data 1110A of the single-line diagram and editing data 1110B of the single-line diagram may include only the reference information about layers 1 to 3, the setting of the overlapping order, and the setting of the display/non-display.

The setting of the layer overlapping order of editing data 1110A in the single-line diagram is in the order of layer 1, layer 2, and layer 3. In addition, layers 3, 2 are set to be displayed, and layer 1 is set to be non-displayed. For this reason, the display of editing data 1110A of the single-line diagram on the display is as illustrated in a display 1120A.

In addition, the setting of the layer overlapping order of editing data 1110B of the single-line diagram is in the order of layer 2, layer 1, and layer 3. In addition, layers 1, 2 are set to be displayed, and layer 3 is set to be non-displayed. For this reason, the display of editing data 1110B of the single-line diagram on the display is as illustrated in a display 1120B.

Figure 12:
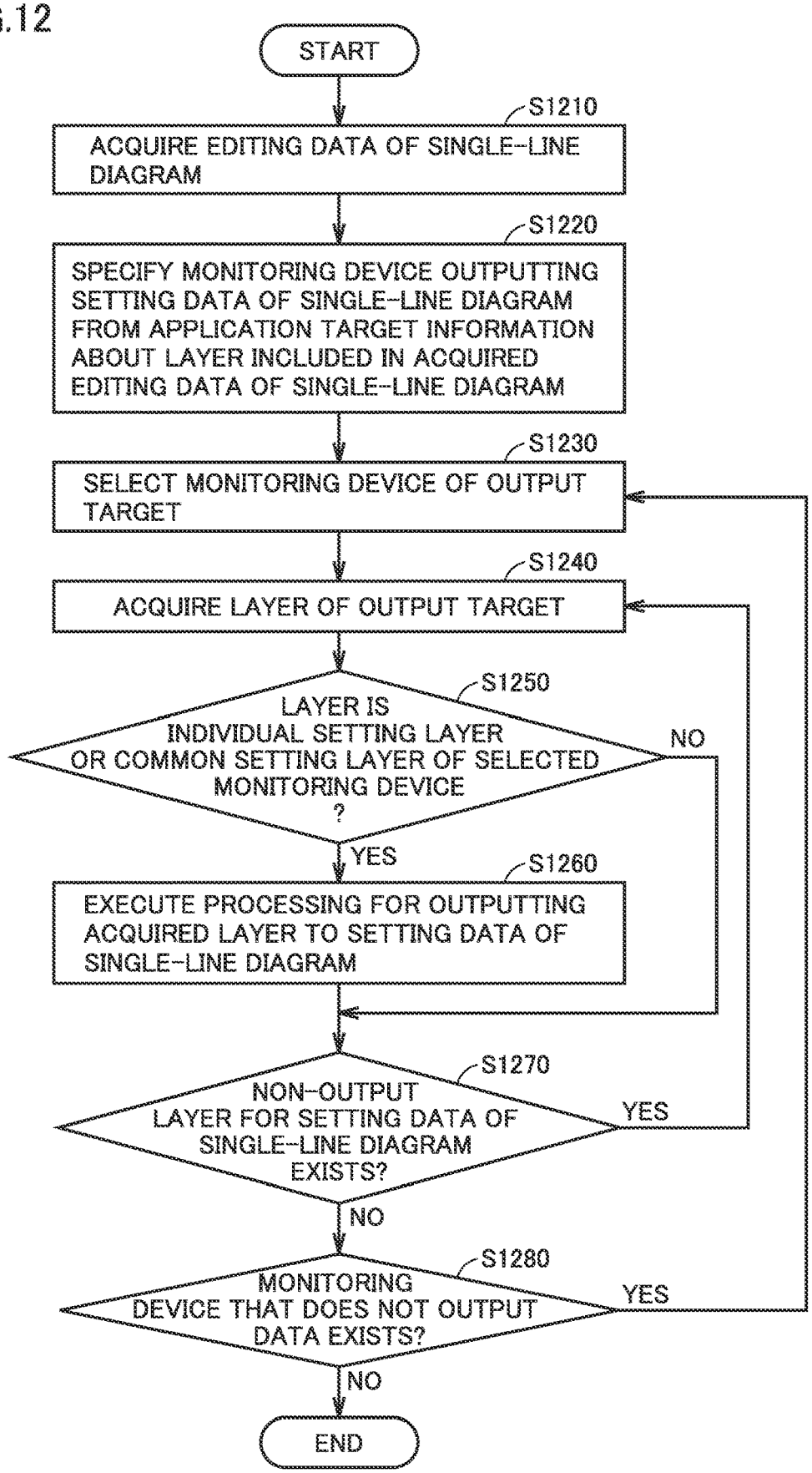
FIG. 12 is a view illustrating an example of a flowchart in internal processing of the setting device 400.

FIG. 12 is a view illustrating an example of a flowchart of internal processing in setting device 400. In one aspect, CPU 901 may read the program performing the processing in FIG. 12 from secondary storage device 903 to primary storage device 902 and execute the program. In another aspect, a part or all of the processing can be implemented as a combination of circuit elements configured to execute the processing.

The flowchart in FIG. 12 illustrates a procedure of processing for generating the setting data of the single-line diagram from the editing data of the single-line diagram.

In step S1210, CPU 901 acquires the editing data of the single-line diagram from secondary storage device 903. In one aspect, the editing data of the single-line diagram acquired by CPU 901 in this step may be the editing data of the single-line diagram including only the reference information about the layer, the setting of the overlapping order, and the setting of the display/non-display (corresponding to editing data 1110A, 1110B of the single-line diagram in FIG. 11).

In step S1220, CPU 901 specifies the monitoring device that outputs the setting data of the single-line diagram from the application target information about the layer included in the acquired editing data of the single-line diagram. For example, when the application target information about the layer included in the acquired editing data of the single-line diagram indicates monitoring device A, CPU 901 specifies monitoring device A as an output destination of the setting data of the single-line diagram. CPU 901 may specify the plurality of monitoring devices as the output destinations of the setting data of the single-line diagram.

In step S1230, CPU 901 selects one of the monitoring devices specified in step S1220 as the output destination of the setting data of the single-line diagram. In one aspect, when specifying monitoring devices A to C in step S1220, CPU 901 can automatically select any one of monitoring devices A to C. In another aspect, CPU 901 may determine the monitoring device selected by the input operation as the output destination of the setting data of the single-line diagram based on the reception of the input operation selecting any one of the monitoring devices specified in step S1220 through input interface 905.

In step S1240, CPU 901 acquires the layer output to the monitoring device selected in step S1230. For example, when selecting monitoring device A in step S1230, CPU 901 selects the layer including the application target information indicating monitoring device A/all the monitoring devices. In one aspect, CPU 901 may acquire the layer based on the reference information about the layer acquired in step S1210.

In step S1250, CPU 901 determines whether the layer acquired in step S1240 is the individual layer for a certain monitoring device or the layer common to all the monitoring devices. When determining that the layer acquired in step S1240 is the individual layer for a certain monitoring device or the layer common to all the monitoring devices (YES in step S1250), CPU 901 shifts the control to step S1260. Otherwise (NO in step S1250), CPU 901 shifts the control to step S1270.

In step S1260, CPU 901 executes processing for outputting the layer acquired in step S1240 to the setting data of the single-line diagram. For example, when monitoring device A is selected in step S1230, CPU 901 executes processing for adding the layer acquired in step S1240 to the setting data of the single-line diagram of monitoring device A.

In step S1270, CPU 901 determines whether the non-output layer for the setting data of the single-line diagram exists. For example, when selecting monitoring device A in step S1230, CPU 901 determines whether the layer that is not yet output to the setting data of the single-line diagram of monitoring device A exists among the layers to be added to the setting data of the single-line diagram of monitoring device A.

When CPU 901 determines that the non-output layer for the setting data of the single-line diagram exists (YES in step S1270), the control proceeds to step S1240. Otherwise (NO in step S1270), CPU 901 shifts the control to step S1280.

In step S1280, CPU 901 determines whether the monitoring device that does not output the setting data of the single-line diagram exists. For example, when specifying monitoring devices A to C in step S1220, CPU 901 determines whether the setting data of the single-line diagram is output to all monitoring devices A to C.

When CPU 901 determines that the monitoring device that does not output the setting data of the single-line diagram exists (YES in step S1280), the control proceeds to step S1230. Otherwise (NO in step S1280), CPU 901 ends the processing.

In one aspect, CPU 901 may directly output the setting data of the single-line diagram to each monitoring device. In another aspect, CPU 901 may store the setting data of the single-line diagram in setting data storage 805.

As described above, setting device 400 of the first embodiment has the function for generating the editing data/setting data of the single-line diagram for each monitoring device by diverting common setting 411 common to each monitoring device. With this function, the user can divert common setting 411 to easily prepare the setting data of the single-line diagram for each monitoring device by preparing common setting 411 common to each monitoring device only once. As a result, the man-hours for preparing the setting data of the single-line diagram can be reduced.

In addition, each setting includes the layer, and setting device 400 has the function for easily generating the setting data of the single-line diagram for each monitoring device based on the combination, the overlapping order, and the display/non-display settings of each layer. With the function, the user can update the editing data/setting data of all the single-line diagrams including a certain layer only by editing the symbol included in the certain layer. As a result, the maintainability of the setting data of the single-line diagram is also improved.

Second Embodiment

A second embodiment will be described below. A setting device of the second embodiment is different from the setting device of the first embodiment in that each layer has a function for associating the internal data. When the single-line diagram displayed in each of a plurality of monitoring devices of the same type installed in one substation is a single-line diagram of a power system connected to the same bus, the single-line diagram may include not only the symbol common to each other but also the internal data common to each other. Therefore, the setting device of the second embodiment can provide a function for more easily generating the setting data of the single-line diagram for each monitoring device by allocating allocation information of the internal data to the common setting.

Figure 13:
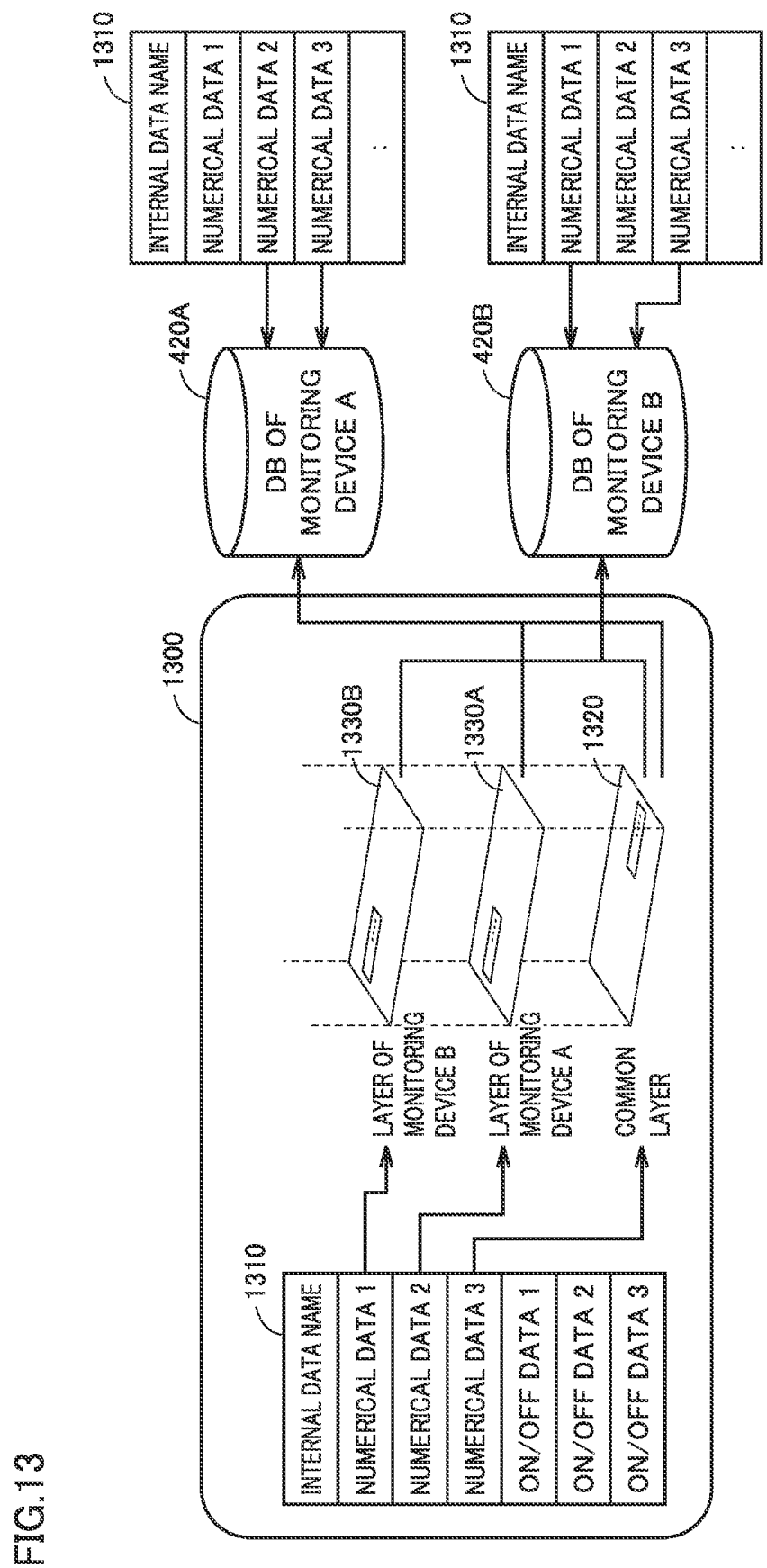
FIG. 13 is a view illustrating an example of a setting file 1300 according to an embodiment.

FIG. 13 is a view illustrating an example of a setting file 1300 of the second embodiment. Setting file 1300 generated and stored by the setting device of the second embodiment includes common setting 1320, individual setting 1330 for each monitoring device, and internal data 1310 associated with each symbol included in the layer (each setting). In the example of FIG. 13, the setting device stores individual settings 1330A, 1330B for monitoring devices A, B.

The monitoring device displaying the single-line diagram can update a numerical value displayed on the single-line diagram in real time based on the internal data acquired from the power system. For example, the internal data is associated with the individual symbol on the layer, and represents an actual measurement value of information about the symbol. For example, the internal data associated with the X-bus in FIG. 1 represents the actual measurement value of the X-bus.

In the example of FIG. 13, "numerical data 1" is associated with the symbol of the layer of monitoring device B. "Numerical data 2" is associated with the symbol of the layer of monitoring device A. "Numerical data 3" is associated with the symbol of the layer common to all the monitoring devices.

The setting device generates the setting data of the single-line diagram for each monitoring device based on common setting 1320 (the layer common to all the monitoring devices), individual setting 1330A (the layer of monitoring device A), individual setting 1330B (the layer of monitoring device B), and the association information about each internal data. For example, the setting data of the single-line diagram stored in DB 420A of monitoring device A includes association information between "numerical data 2" and the symbol on the "layer of monitoring device A" and association information between "numerical data 3" and the symbol on the "layer common to all the monitoring devices". Similarly, the setting data of the single-line diagram stored in DB 420B of monitoring device B includes association information between "numerical data 1" and the symbol on "the layer of the monitoring device B" and association information between "numerical data 3" and the symbol on "the layer common to all the monitoring devices".

Figure 14:
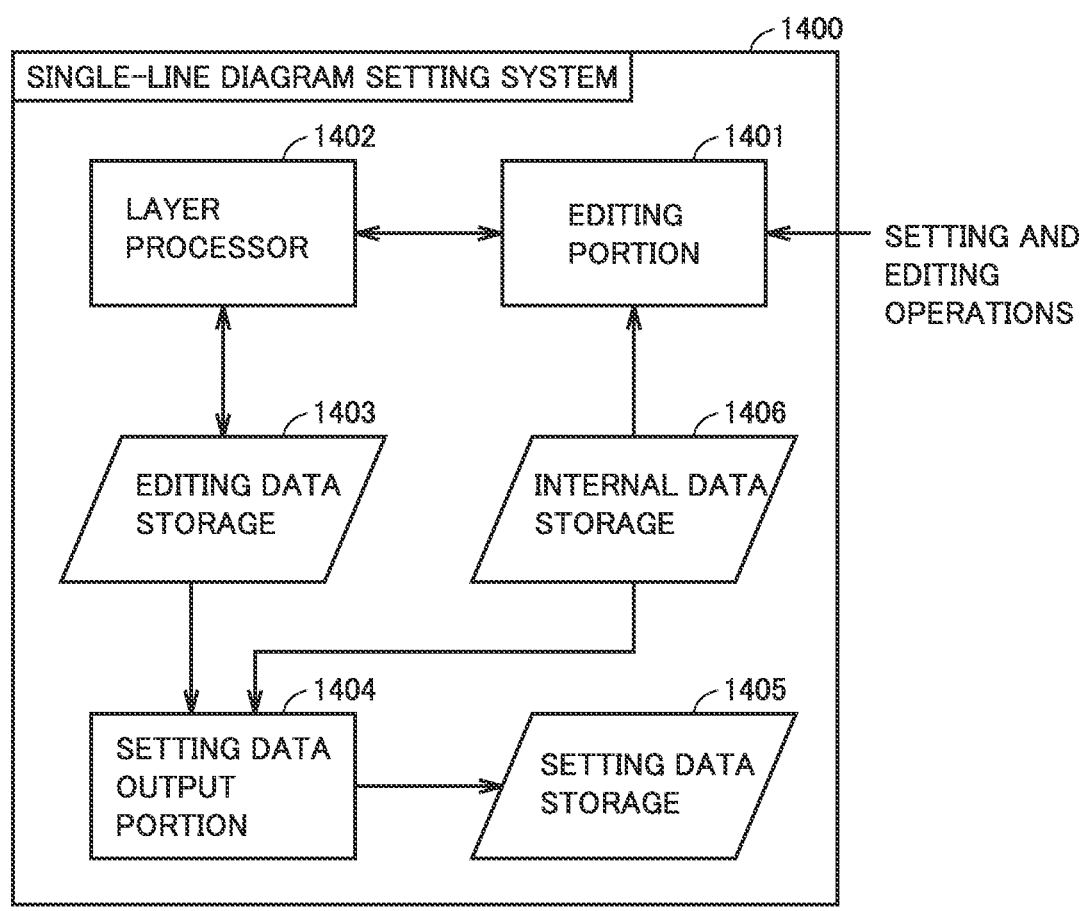
FIG. 14 illustrates an example of a configuration of a functional block in a setting device 1400 according to an embodiment.

FIG. 14 illustrates an example of a configuration of functional blocks in a setting device 1400 of the second embodiment. The functional blocks in FIG. 14 further includes a function related to the internal data in addition to the function of the functional block in FIG. 8. In one aspect, the functional blocks in FIG. 14 can be implemented as hardware. In another aspect, the functional blocks in FIG. 14 can be implemented as software. In that case, each functional block can be executed on the hardware of information processing device 900 in FIG. 9.

Setting device 1400 includes an editing portion 1401, a layer processing portion 1402, an editing data storage 1403, a setting data output portion 1404, a setting data storage 1405, and an internal data storage 1406. Editing portion 1401 provides the editing screen for editing the editing data of the single-line diagram. The user can execute the operation of associating the internal data for each symbol disposed in each layer through the editing screen.

Internal data storage 1406 stores the internal data of the power system of the maintenance target. In one aspect, the internal data may be an address of a memory in which a value of a certain sensor or the like is written. For example, editing portion 1401 can display a list of the internal data read from internal data storage 1406, and present the list to the user.

Layer processing portion 1402 can also manage the association information about the internal data for each symbol disposed in each layer in addition to information about each layer included in the editing data of the single-line diagram. Editing data storage 1403 stores the editing data of the single-line diagram. The editing data of the single-line diagram includes the association information about the internal data with respect to each symbol disposed in each layer in addition to the information about the layer.

Setting data output portion 1404 converts the editing data of the single-line diagram stored in editing data storage 1403 into the setting data of the single-line diagram, and stores the setting data of the single-line diagram in setting data storage 1405. At that time, setting data output portion 1404 includes the association information about the internal data with respect to each symbol disposed in each layer in the setting data of the single-line diagram. For example, the setting data of the single-line diagram of monitoring device A may include the association information about the internal data with respect to the symbol on the layer of monitoring device A and the association information about the internal data with respect to the symbol on the layer common to all the monitoring devices.

Setting data storage 1405 stores the setting data of the single-line diagram. The setting data of the single-line diagram includes the association information about the internal data with respect to each symbol disposed in each layer. In one aspect, setting data storage 1405 may transmit the setting data of the single-line diagram to the monitoring device based on the acceptance of the request for the setting data of the single-line diagram from the monitoring device.

Figure 15:
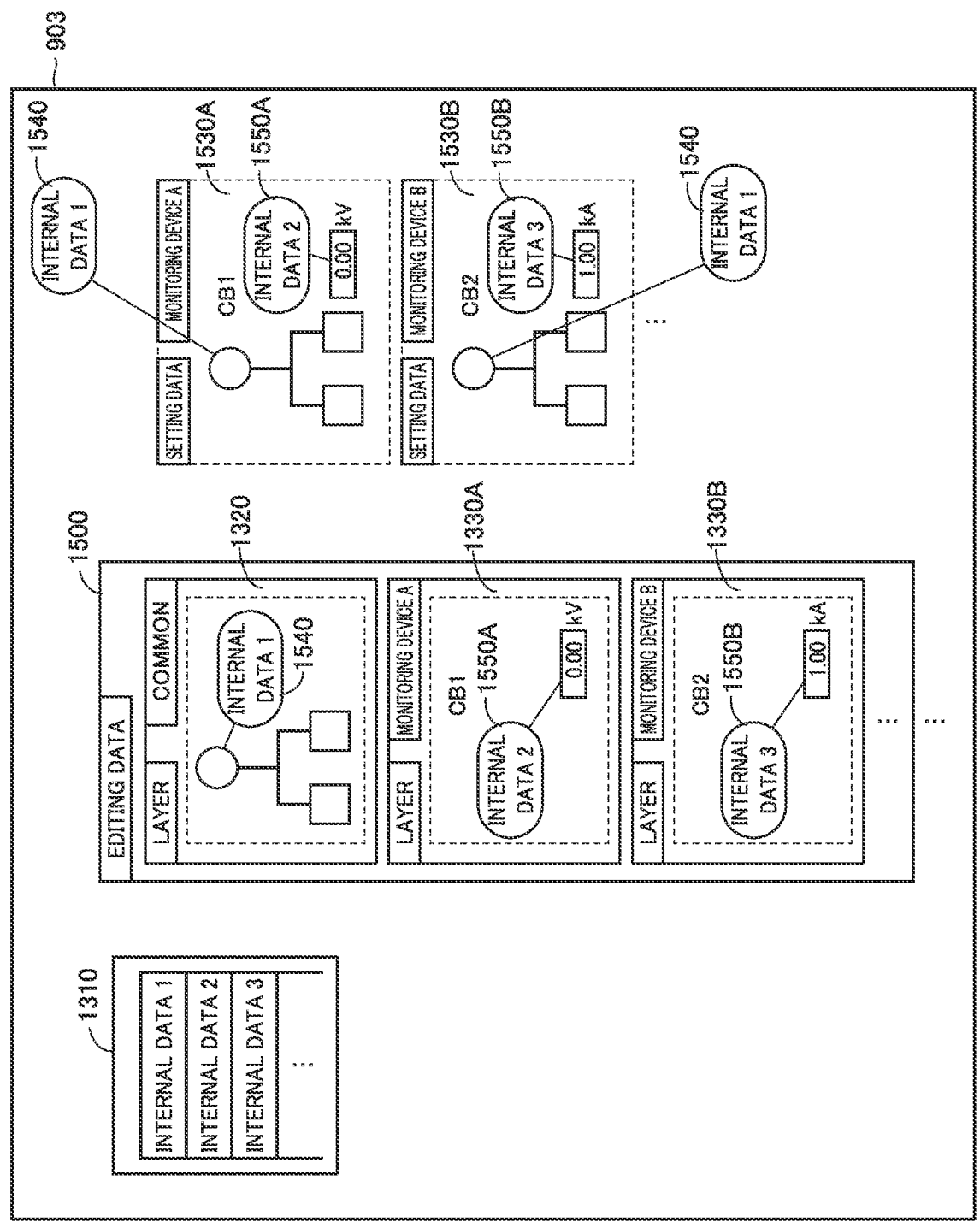
FIG. 15 is a view illustrating an example of the editing data of a single-line diagram and the setting data of the single-line diagram that are stored in the setting device 1400.

FIG. 15 is a view illustrating an example of the editing data of the single-line diagram and the setting data of the single-line diagram that are stored in setting device 1400.

The editing data of the single-line diagram can be stored in secondary storage device 903. In the example of FIG. 15, secondary storage device 903 stores internal data 1310, editing data 1500 of the single-line diagram, and setting data 1530 of the single-line diagram.

Internal data 1310 is stored in a region secured as internal data storage 1406 on secondary storage device 903. In one aspect, internal data 1310 may be a set of the plurality of pieces of internal data (such as "numerical data 1 to 3"). Internal data storage 1406 stores the actual measurement value (current, voltage, or the like) of each facility in the power system of the maintenance target. The actual measurement value of each facility can be updated as needed.

Editing data 1500 of the single-line diagram is stored in the region secured as editing data storage 1403 on secondary storage device 903. Editing data storage 1403 can store editing data 1500 of one or the plurality of single-line diagrams. Editing data 1500 of the single-line diagram includes the association information for the symbol of internal data 1310 or a part or all of internal data 1310 associated with the symbol in addition to all the information included in editing data 1000 of the single-line diagram in FIG. 10.

For example, common setting 1320 includes association information 1540 about "internal data 1" with respect to the symbol on the layer of common setting 1320. Individual setting 1330A of monitoring device A includes association information 1550A about "internal data 2" with respect to the symbol on the layer of the individual setting 1330A. Further, individual setting 1330B of monitoring device B includes association information 1550B about "internal data 3" with respect to the symbol on the layer of individual setting 1330B.

Setting data 1530 of the single-line diagram is stored in the region secured as setting data storage 1405 on secondary storage device 903. Setting data storage 1405 can store setting data 1530 of one or the plurality of single-line diagrams. Setting data 1530 of the single-line diagram includes the association information for the symbol of internal data 1310 or a part or all of internal data 1310 associated with the symbol in addition to all the information included in setting data 1030 of the single-line diagram in FIG. 10. For example, setting data 1530A of the single-line diagram of monitoring device A includes association information 1540 about "internal data 1" and association information 1550A of "internal data 2". Setting data 1530B of the single-line diagram of monitoring device B includes association information 1540 about "internal data 1" and the association information 1550B about "internal data 3".

FIG. 16 is a view illustrating an example of incidental information 1600 about internal data 1310. Internal data 1310 may include incidental information 1600 in addition to the actual measurement value of the facility in the power system of the maintenance target. As an example, incidental information 1600 may include an identifier (ID) 1601, a unit 1602, a data type 1603, a maximum value 1604, and a minimum value 1605. In one aspect, setting device 1400 may store incidental information 1600 in the region of internal data storage 1406 in secondary storage device 903. In another aspect, setting device 1400 may store incidental information 1600 in the region different from internal data storage 1406 in secondary storage device 903. Setting device 1400 can appropriately refer to incidental information 1600.

ID 1601 uniquely identifies the actual measurement value (voltage, current, or the like) of each facility. Unit 1602 indicates the unit of the actual measurement value of each facility. Data type 1603 defines the data type of the actual measurement value of each facility. Maximum value 1604 is the maximum value of the actual measurement value of each facility. In one aspect, maximum value 1604 may be the maximum value of the actual measurement value measured in the past or the maximum value of an allowable range of the actual measurement value. Minimum value 1605 is the minimum value of the actual measurement value of each facility. In one aspect, minimum value 1605 may be the minimum value of the actual measurement value measured in the past or the minimum value of an allowable range of the actual measurement value.

FIG. 17 is a view illustrating an example of a configuration of a setting file 1700 included in the editing data of the single-line diagram. In the example of FIG. 17, setting file 1700 includes a setting file 1710 of the common setting and a setting file 1720 of the individual setting of monitoring device A.

Setting file 1710 includes "layer 1" common to all the monitoring devices and a "symbol 1" and a "symbol 2" on "layer 1". Furthermore, setting file 1710 includes the reference information about the internal data associated with each symbol and screen display information. For example, the "screen display information" includes information such as setting of the overlapping order and setting of display/non-display.

Setting file 1720 includes "layer 2" for monitoring device A and a "symbol 10" on "layer 2". Furthermore, similarly to setting file 1710, setting file 1720 can include the reference information about the internal data associated with each symbol and the screen display information. As described above, setting file 1700 is a set of setting files managed for each layer.

Figure 18:
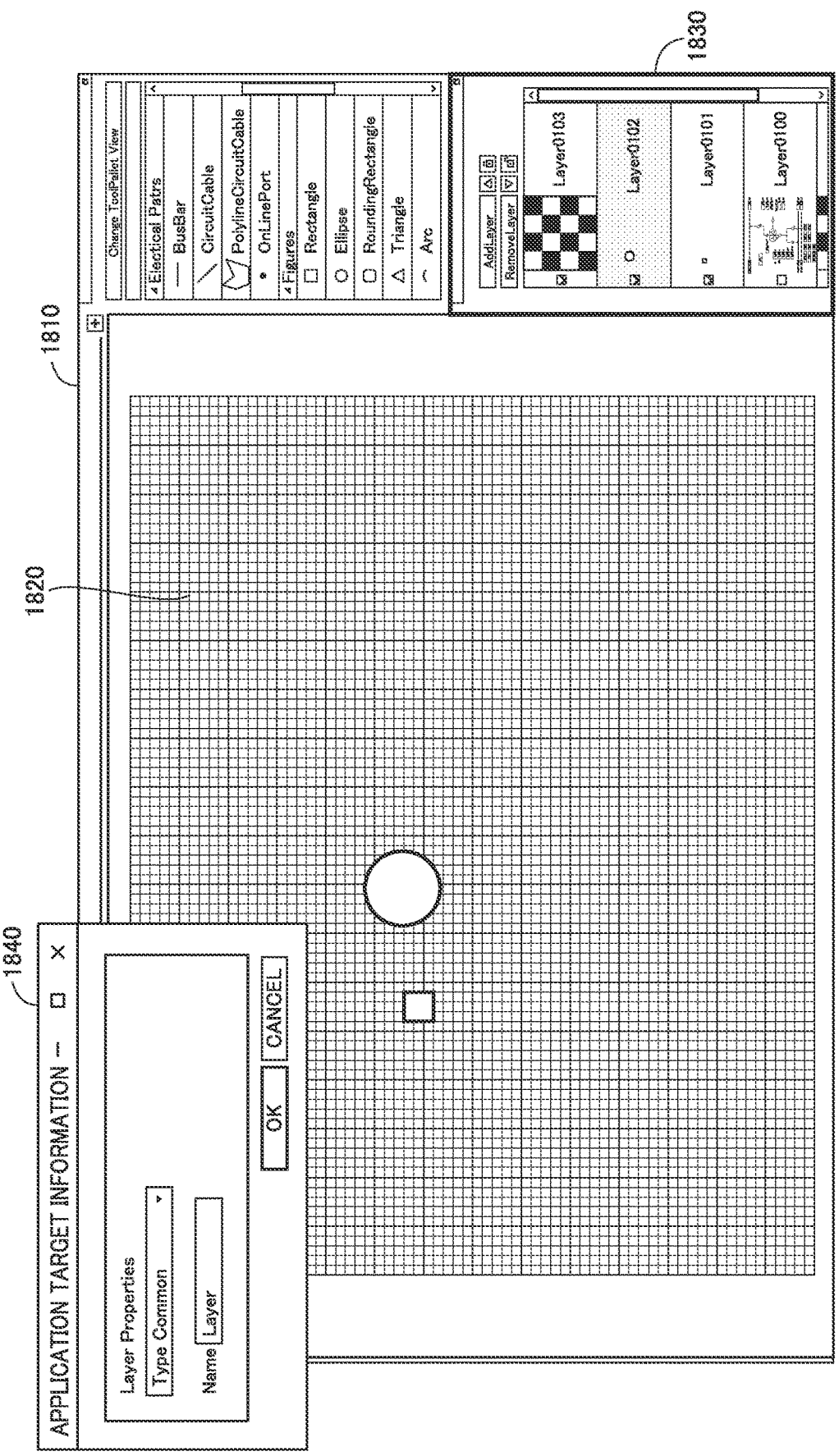
FIG. 18 is a view illustrating a first example of a screen of an editing screen 1810 provided by an editing portion 1401.
Figure 19:
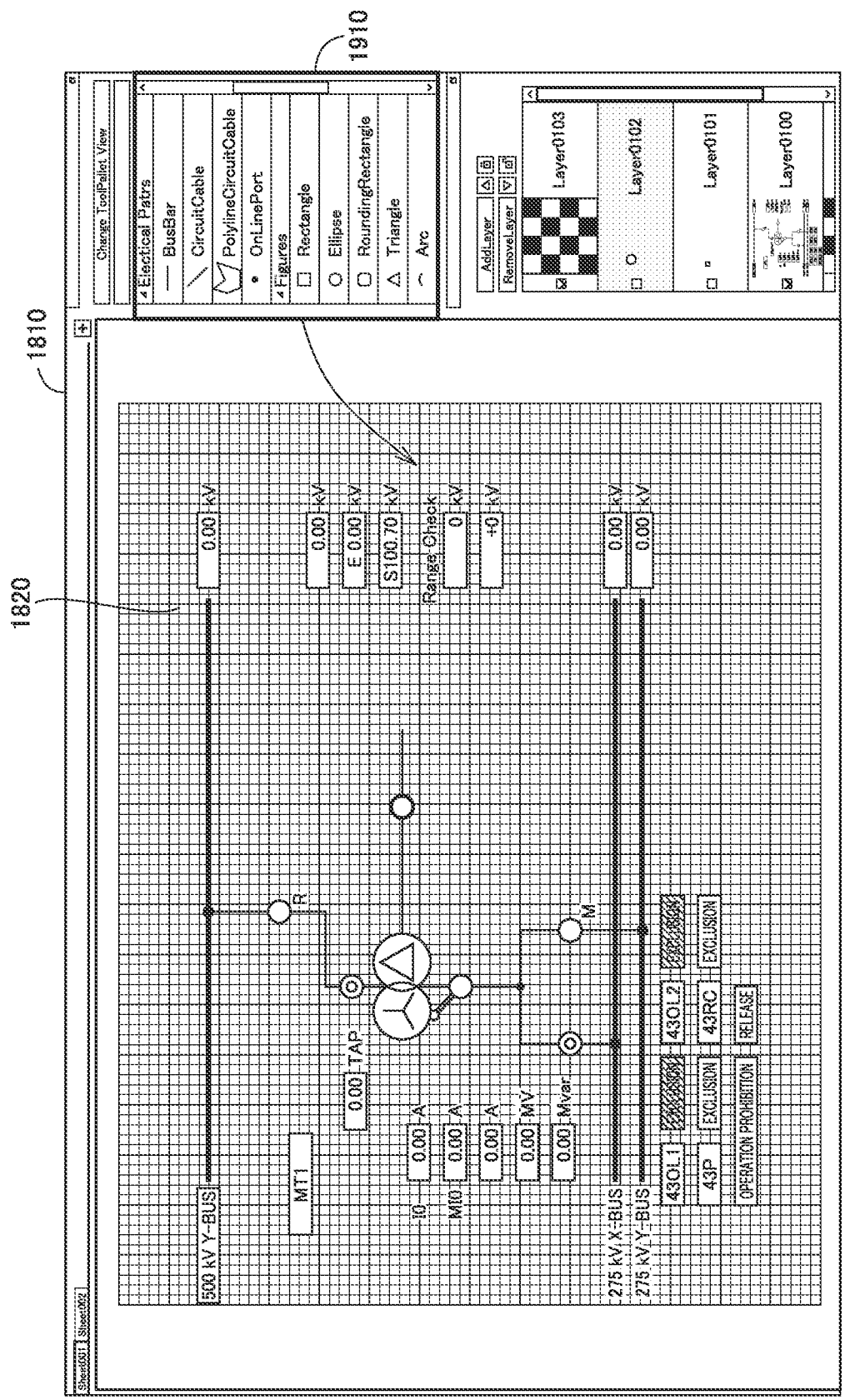
FIG. 19 is a view illustrating a second example of the screen of the editing screen 1810 provided by the editing portion 1401.
Figure 20:
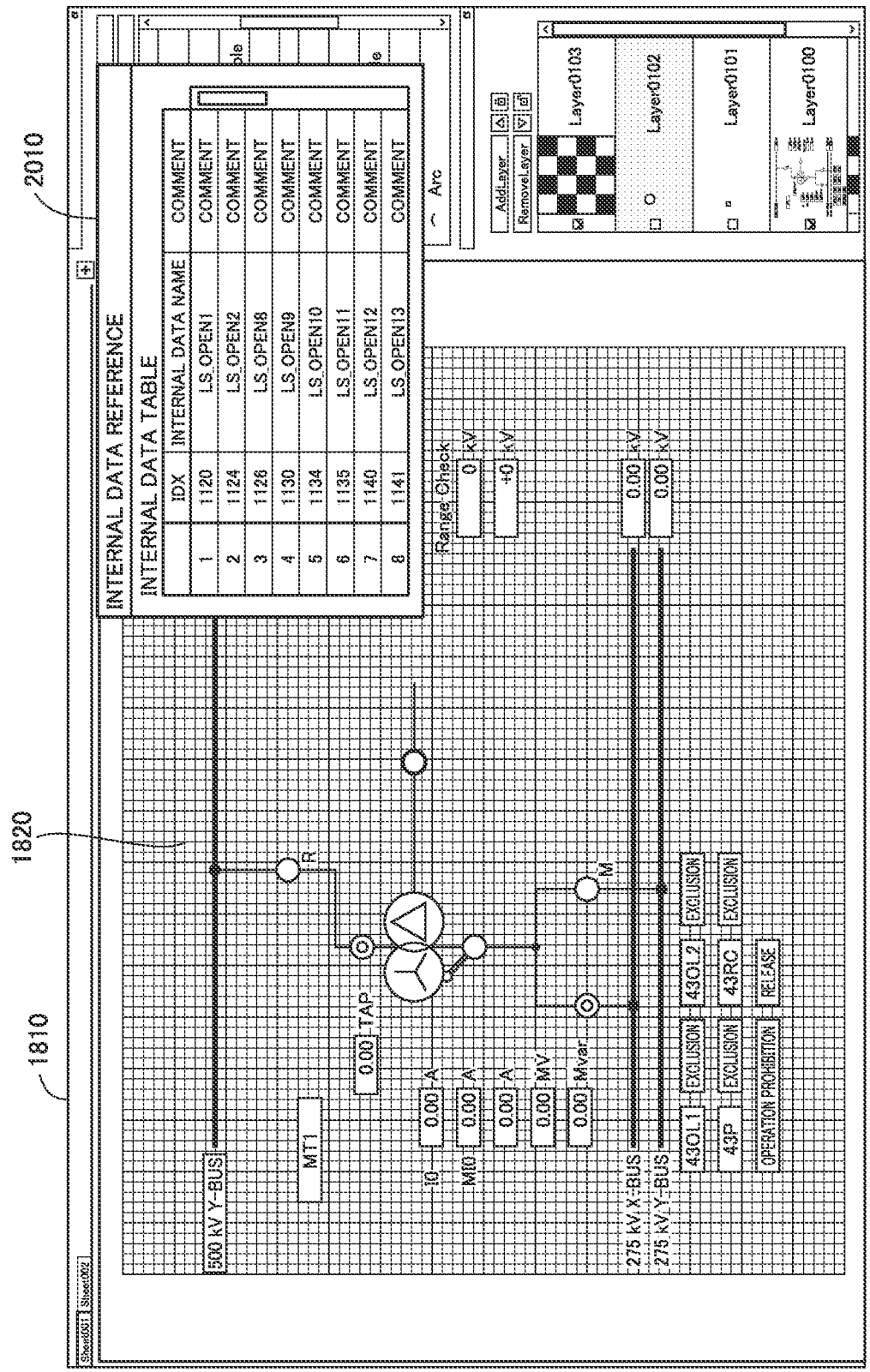
FIG. 20 is a view illustrating a third example of the screen of the editing screen 1810 provided by the editing portion 1401.

With reference to FIGS. 18 to 20, the editing screen provided by editing portion 1401 of setting device 1400 will be described below. Editing portion 801 of setting device 400 can also provide the editing screens in FIGS. 18 to 20 to the user.

FIG. 18 is a view illustrating a first example of a screen of an editing screen 1810 provided by editing portion 1401. Setting device 1400 can display editing screen 1810 on the display connected to output interface 906. In addition, setting device 1400 can receive the operation input of the user to editing screen 1810 through various input instruments (such as a keyboard and/or a mouse) connected to input interface 905. Furthermore, setting device 1400 can store the editing data of the single-line diagram edited on editing screen 1810 in secondary storage device 903 based on the reception of the storage operation input from the user.

Editing screen 1810 includes a work region 1820, a layer property 1830, and a layer setting dialog 1840. Work region 1820 provides a layer editing function. The user can define the layer by disposing the symbol in the region (the region of the layer) displayed in the work region.

Layer property 1830 can display the list of defined layers. Furthermore, the user can refer to the information about each layer from layer property 1830. For example, by referring to layer property 1830, the user can determine whether each layer is the layer of the common setting for all the monitoring devices or the layer of the individual setting for a certain monitoring device. Furthermore, layer property 1830 can provide the function for setting the overlapping order of each layer and the function for setting the display/non-display of each layer.

Layer setting dialog 1840 provides the function for defining the application target information about the layer. For example, the user can set whether a certain layer is the layer of the common setting or the layer of the individual setting of a certain monitoring device on layer setting dialog 1840. In one aspect, layer setting dialog 1840 can be displayed when new layer preparation is selected from a menu or the like of editing screen 1810. In another aspect, when the layer is selected from layer property 1830, layer setting dialog 1840 may be displayed together with the application target information about the selected layer. In another aspect, layer setting dialog 1840 may be displayed as a screen different from editing screen 1810. Furthermore, in another aspect, layer setting dialog 1840 may be displayed as a part of editing screen 1810.

FIG. 19 is a view illustrating a second example of the screen of editing screen 1810 provided by editing portion 1401. Editing screen 1810 further includes a symbol panel 1910. Symbol panel 1910 displays the list of symbols that can be disposed in work region 1820. The user can select a certain symbol from symbol panel 1910 to dispose the selected symbol in work region 1820. For example, the user may drag and drop the symbol from symbol panel 1910 to dispose the symbol in work region 1820.

FIG. 20 is a view illustrating a third example of the screen of editing screen 1810 provided by editing portion 1401. Editing screen 1810 further includes an internal data dialog 2010. Internal data dialog 2010 provides a function for associating the actual measurement value of each facility included in the internal data with each symbol. In one aspect, internal data dialog 2010 may be displayed as a screen separate from editing screen 1810. In another aspect, internal data dialog 2010 may be displayed as a part of editing screen 1810.

As described above, setting device 1400 of the second embodiment has the function for associating the internal data with the symbol of each layer in addition to the function for generating the editing data/setting data of the single-line diagram for each monitoring device by diverting the common setting common to each monitoring device. With this function, the user can prepare the setting data of the single-line diagram for each monitoring device by diverting not only the symbol but also the internal data common to each monitoring device.

Furthermore, editing screen 1810 provides the function for visually defining the layer and associating the internal data with each symbol. Using editing screen 1810, the user can superimpose and check the common setting and the individual setting even while editing each setting. As a result, the user can easily prepare the setting data of the single-line diagram for each monitoring device as assumed. The respective embodiments may be implemented in an appropriate combination.

It should be considered that the disclosed embodiments are an example in all respects and not restrictive. The scope of the present disclosure is defined by not the description above, but the claims, and it is intended that all modifications within the meaning and scope of the claims and their equivalents are included in the present invention. In addition, the disclosed contents described in the embodiment and the modification are intended to be implemented alone or in combination as much as possible.

REFERENCE SIGNS LIST 100, 200A, 200B, 300A, 300B, 601A, 601B: single-line diagram, 110, 210A, 210B, 220A, 220B: symbol, 120, 1310: internal data, 301A, 301B, 410, 1000, 1110A, 1110B, 1500: editing data of single-line diagram, 303A, 303B, 1530, 1530A, 1530B: setting data of single-line diagram, 310, 411, 1010, 1320: common setting, 320, 412, 412A, 412B, 1020A, 1020B, 1330, 1330A, 1330B: individual setting, 400, 1400: setting device, 415, 804, 1404: setting data output portion, 420A: DB of monitoring device A, 420B: DB of monitoring device B, 420C: DB of monitoring device C, 600A, 600B, 700, 1300, 1700, 1710, 1720: setting file, 801, 1401: editing portion, 802, 1402: layer processing portion, 803, 1403: editing data storage, 805, 1405: setting data storage, 900: information processing device, 901: CPU, 902: primary storage device, 903: secondary storage device, 904: external instrument interface, 905: input interface, 906: output interface, 907: communication interface, 1120A, 1120B: display, 1406: internal data storage, 1540, 1550A, 1550B: association information, 1600: incidental information, 1601: ID, 1602: unit, 1603: data type, 1604: maximum value, 1605: minimum value, 1810: editing screen, 1820: work region, 1830: layer property, 1840: layer setting dialog, 1910: symbol panel, 2010: internal data dialog

The invention claimed is:

1. A device comprising:
an input portion to receive an operation related to a single-line diagram;
a controller to generate setting data of the single-line diagram based on the operation; and
a storage to store the setting data,
wherein the input portion receives first setting related to a first power system, second setting related to a second power system, and third setting common to the first and second power systems, and
the controller
generates setting data of a first single-line diagram including the first setting and the third setting,
generates setting data of a second single-line diagram including the second setting and the third setting, and
stores the setting data of the first single-line diagram and the setting data of the second single-line diagram in the storage.

2. The device according to claim 1, wherein the first setting includes a first layer related to the first power system,
the second setting includes a second layer related to the second power system,
the third setting includes a third layer common to the first and second power systems, each of the layers includes one or a plurality of symbols, and
the symbol is a figure indicating an instrument of a monitoring target.

3. The device according to claim 2, wherein the input portion receives input changing overlapping order of each of the layers, and
the controller determines the overlapping order of each of the layers in the setting data of the first and second single-line diagrams based on the input changing the overlapping order.

4. The device according to claim 2, wherein the input portion receives input setting of display/non-display of each of the layers, and
the controller determines display setting of each of the layers based on each setting of the display/non-display for each of the layers.

5. The device according to claim 4, wherein the generating the setting data of the first and second single-line diagrams includes:

generating editing data of the first and second single-line diagrams including information about a combination of the first setting, the second setting, and the third setting; and
generating the setting data of each of the first and second single-line diagrams based on the editing data of each of the first and second single-line diagrams.

6. The device according to claim 4, wherein the first setting includes first internal data related to the first power system,
the second setting includes second internal data related to the second power system,
the third setting includes third internal data common to the first power system and the second power system, and
each of the internal data is measured from each of a plurality of the instruments of the monitoring targets.

7. The device according to claim 6, wherein each of the internal data is a voltage value or a current value.

8. The device according to claim 6, wherein each of the internal data is associated with one of the symbols.

9. The device according to claim 8, wherein the generating the setting data of the first and second single-line diagrams includes:
generating editing data of first and second single-line diagrams including information about a combination of each of the settings and information about association between each of the internal data and each of the symbols; and
generating setting data for each of the first and second single-line diagrams based on the editing data for each of the first and second single-line diagrams.

10. A computer-implemented method for generating a single-line diagram comprising:
receiving first setting related to a first power system, second setting related to a second power system, and third setting common to the first and second power systems;
generating setting data of a first single-line diagram including the first setting and the third setting;
generating setting data of a second single-line diagram including the second setting and the third setting; and
storing the setting data of the first single-line diagram and the setting data of the second single-line diagram in a storage.

11. The computer-implemented method according to claim 10, wherein the first setting includes a first layer related to the first power system,
the second setting includes a second layer related to the second power system,
the third setting includes a third layer common to the first and second power systems,
each of the layers includes one or a plurality of symbols, and
the symbol is a figure indicating an instrument of a monitoring target.

12. The computer-implemented method according to claim 11, further comprising:
receiving input changing overlapping order of each of the layers; and
determining the overlapping order of each of the layers in setting data of the first and second single-line diagrams based on the input changing the overlapping order.

13. The computer-implemented method according to claim 11, further comprising:
receiving input of setting of display/non-display of each of the layers; and determining a display setting for each of the layers based on each setting of the display/non-display for each of the layers.

14. The computer-implemented method according to claim 13, wherein the generating the setting data of the first and second single-line diagrams includes:
generating editing data of the first and second single-line diagrams including information about a combination of the first setting, the second setting, and the third setting; and
generating the setting data of each of the first and second single-line diagrams based on the editing data of each of the first and second single-line diagrams.

15. The computer-implemented method according to claim 13, wherein the first setting includes first internal data related to the first power system,
the second setting includes second internal data related to the second power system,
the third setting includes third internal data common to the first power system and the second power system, and
each of the internal data is measured from each of a plurality of the instruments of the monitoring targets.

16. The computer-implemented method according to claim 15, wherein each of the internal data is a voltage value or a current value.

17. The computer-implemented method according to claim 15, wherein each of the internal data is associated with one of the symbols.

18. The computer-implemented method according to claim 17, wherein the generating the setting data of the first and second single-line diagrams includes:
generating editing data of first and second single-line diagrams including information about a combination of each of the settings and information about association between each of the internal data and each of the symbols; and
generating setting data for each of the first and second single-line diagrams based on the editing data for each of the first and second single-line diagrams.

19. A non-transitory computer-readable medium comprising a program for causing one or a plurality of processors to execute the method of claim 10.

* * * * *